US010710392B2

(12) United States Patent
Holmes

(10) Patent No.: US 10,710,392 B2
(45) Date of Patent: Jul. 14, 2020

(54) DIFFRACTIVE SECURITY DEVICE AND METHOD OF MANUFACTURE THEREOF

(71) Applicant: DE LA RUE INTERNATIONAL LIMITED, Basingstoke, Hampshire (GB)

(72) Inventor: Brian William Holmes, Fleet (GB)

(73) Assignee: DE LA RUE INTERNATIONAL LIMITED, Basingstoke (GB)

( * ) Notice: Subject to any disclaimer, the term of this patent is extended or adjusted under 35 U.S.C. 154(b) by 68 days.

(21) Appl. No.: 15/746,255

(22) PCT Filed: Jul. 22, 2016

(86) PCT No.: PCT/GB2016/052231
§ 371 (c)(1),
(2) Date: Jan. 19, 2018

(87) PCT Pub. No.: WO2017/017421
PCT Pub. Date: Feb. 2, 2017

(65) Prior Publication Data
US 2018/0201044 A1    Jul. 19, 2018

(30) Foreign Application Priority Data

Jul. 24, 2015    (GB) .................................. 1513096.6

(51) Int. Cl.
*G03H 1/00*        (2006.01)
*B42D 25/328*    (2014.01)
(Continued)

(52) U.S. Cl.
CPC ........ *B42D 25/328* (2014.10); *B29C 33/3842* (2013.01); *B29C 39/02* (2013.01);
(Continued)

(58) Field of Classification Search
CPC . B29D 11/0074; B42D 25/324; G03H 1/0011
(Continued)

(56) References Cited

U.S. PATENT DOCUMENTS 9,676,156 B2 *    6/2017    Tompkin ............ B29D 11/0074
2006/0072225 A1    4/2006    Schilling et al.
(Continued)

FOREIGN PATENT DOCUMENTS

AU    2015100671 A4    6/2015
WO    2007/149692 A2    12/2007
WO    2010/121293 A1    10/2010

OTHER PUBLICATIONS

Jan. 30, 2018 International Preliminary Report on Patentability issued in International Patent Application No. PCT/GB2016/052231.
(Continued)

*Primary Examiner* — Audrey Y Chang
(74) *Attorney, Agent, or Firm* — Oliff PLC

(57) ABSTRACT

A diffractive security device is disclosed including at least a first diffractive structure defined in a carrier layer. The first diffractive structure is an on-axis diffractive zone plate structure of a continuously curved surface configured such that when the device is illuminated by on-axis light a first diffraction pattern generated by the first diffractive structure can be viewed from at least a first side of the device at substantially all viewing angles, the first diffraction pattern exhibiting a reference point or reference line relative to which other features of the first diffraction pattern appear to move when the viewing angle is changed.

28 Claims, 17 Drawing Sheets

(51) Int. Cl.
| | |
|---|---|
| B41M 3/14 | (2006.01) |
| B42D 25/425 | (2014.01) |
| B42D 25/324 | (2014.01) |
| B42D 25/21 | (2014.01) |
| B42D 25/29 | (2014.01) |
| G07D 7/00 | (2016.01) |
| B42D 25/355 | (2014.01) |
| B42D 25/378 | (2014.01) |
| B42D 25/445 | (2014.01) |
| B29C 33/38 | (2006.01) |
| B29C 39/02 | (2006.01) |
| B29C 59/02 | (2006.01) |
| G02B 5/18 | (2006.01) |
| G03F 7/00 | (2006.01) |
| G03F 7/20 | (2006.01) |
| B42D 25/351 | (2014.01) |
| B29L 11/00 | (2006.01) |

(52) U.S. Cl.
CPC ........... *B29C 59/026* (2013.01); *B41M 3/148* (2013.01); *B42D 25/21* (2014.10); *B42D 25/29* (2014.10); *B42D 25/324* (2014.10); *B42D 25/355* (2014.10); *B42D 25/378* (2014.10); *B42D 25/425* (2014.10); *B42D 25/445* (2014.10); *G02B 5/1857* (2013.01); *G02B 5/1876* (2013.01); *G03F 7/0017* (2013.01); *G03F 7/2006* (2013.01); *G07D 7/0032* (2017.05); *B29L 2011/00* (2013.01); *B42D 25/351* (2014.10)

(58) Field of Classification Search
USPC .......................... 359/2, 569, 565, 15; 283/86
See application file for complete search history.

(56) References Cited

U.S. PATENT DOCUMENTS

| | | |
|---|---|---|
| 2008/0067801 A1 | 3/2008 | Schilling et al. |
| 2008/0088895 A1* | 4/2008 | Argoitia .................. C09J 11/02 359/2 |
| 2009/0008923 A1 | 1/2009 | Kaule et al. |
| 2009/0317595 A1 | 12/2009 | Brehm et al. |
| 2014/0247499 A1 | 9/2014 | Doublet et al. |

OTHER PUBLICATIONS

Jan. 26, 2016 Search Report issued in British Application 1513096.6.

Jan. 9, 2017 Search Report issued in British Application No. 1612743.3.

Oct. 21, 2016 International Search Report issued in International Application No. PCT/GB2016/052231.

Oct. 21, 2016 Written Opinion issued in International Application No. PCT/GB2016/052231.

* cited by examiner

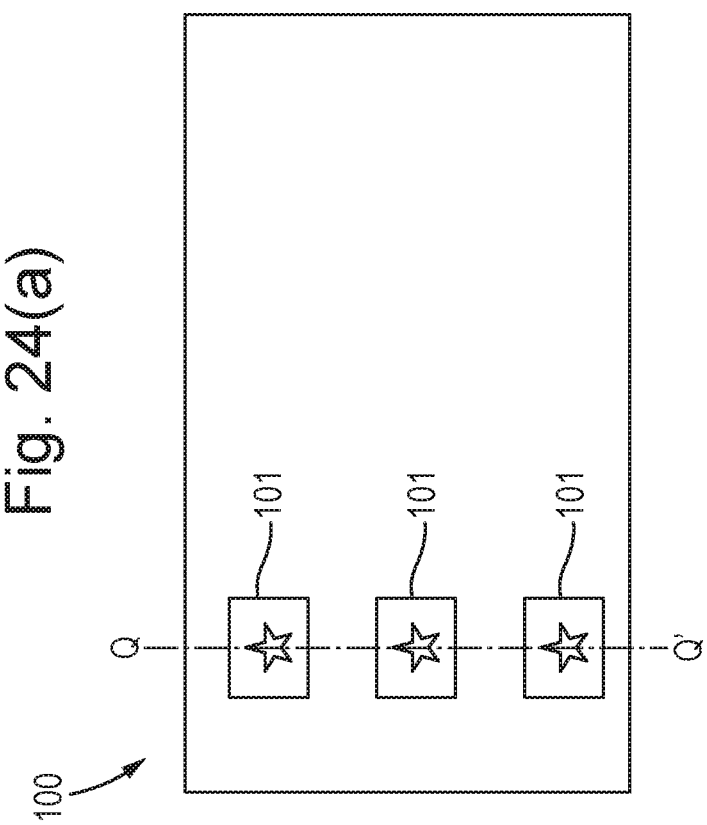
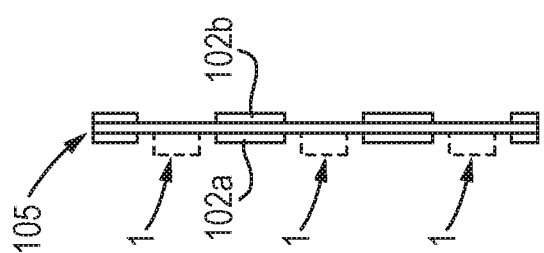
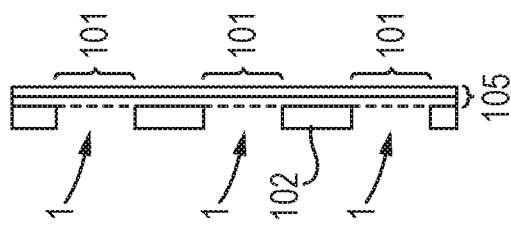

DIFFRACTIVE SECURITY DEVICE AND METHOD OF MANUFACTURE THEREOF

This invention relates to security devices for use in checking the authenticity of articles of value, particularly security documents such as banknotes, passports, identity documents, driving licenses, stamps, visas and the like. Methods of making the security devices are also disclosed.

Articles of value, and particularly documents of value such as banknotes, cheques, passports, identification documents, certificates and licenses, are frequently the target of counterfeiters and persons wishing to make fraudulent copies thereof and/or changes to any data contained therein. Typically such objects are provided with a number of visible security devices for checking the authenticity of the object. Examples include features based on one or more patterns such as microtext, fine line patterns, latent images, venetian blind devices, lenticular devices, moiré interference devices and moiré magnification devices, each of which generates a secure visual effect. Other known security devices include holograms, watermarks, embossings, perforations and the use of colour-shifting or luminescent/fluorescent inks. Common to all such devices is that the visual effect exhibited by the device is extremely difficult, or impossible, to copy using available reproduction techniques such as photocopying. Security devices exhibiting non-visible effects such as magnetic materials may also be employed.

One class of security devices are those which produce an optically variable effect, meaning that the appearance of the device is different at different angles of view. Such devices are particularly effective since direct copies (e.g. photocopies) will not produce the optically variable effect and hence can be readily distinguished from genuine devices. Optically variable effects can be generated based on various different mechanisms, including holograms and other diffractive devices such as Kinegrams™, and also devices which make use of focusing elements such as lenses, including moiré magnifier devices, integral imaging devices and so-called lenticular devices.

Diffractive security devices such as holograms and Kinegrams™ have a number of benefits including the ability to generate strong and distinctive visual effects whilst being very difficult to replicate without specialist equipment. Nonetheless, new security devices and effects are necessary in order to stay ahead of counterfeiters' ability to imitate existing designs.

In accordance with the present invention, a diffractive security device is provided comprising:
- at least a first diffractive structure defined in a carrier layer, the first diffractive structure being an on-axis diffractive zone plate structure of a continuously curved surface configured such that when the device is illuminated by on-axis light a first diffraction pattern generated by the first diffractive structure can be viewed from at least a first side of the device at substantially all viewing angles, the first diffraction pattern exhibiting a reference point or reference line relative to which other features of the first diffraction pattern appear to move when the viewing angle is changed;
- wherein the device has an array of first regions in the form of indicia in each of which a part of the first diffractive structure is present, the first regions being spaced by one or more non-diffractive regions of the device, wherein each of the first regions exhibits a portion of the first diffraction pattern;

such that upon changing the viewing angle in a continuous sense, features of the first diffraction pattern appear to move from one first region to the next so as to highlight and/or reveal different indicia of the array.

The disclosed security device exhibits a new and distinctive visual effect in which the first diffraction pattern is exhibited in the first regions only and is absent therebetween, whilst at the same time it is apparent that it is the same first diffraction pattern exhibited by all of the first regions since, as the viewing angle is changed, features of that pattern (such as relatively bright areas and/or particular colours) will appear to move progressively from one first region to the next. That is, as the device is tilted and/or rotated, a feature of the first diffraction pattern which is visible in one first region will move towards the periphery of that first region and then, upon continued tilting/rotation in the same direction, cease to be visible until the viewing position reaches an angle at which the same feature reappears inside the nearest periphery of the next first region. It will be appreciated that each first region will contain only a part (i.e. not all) of the first diffraction structure and hence typically the actual diffractive structures present in at least some of the first regions (preferably all) will be different from one another, e.g. in terms of their pitch, orientation, size and/or peripheral shape, because they are fragments taken from different places of the first diffraction structure as a whole. However since all the fragments are parts of the same first diffraction structure, the above-described movement effect from one first region to the next will be exhibited by the first regions in combination.

Due to the nature of the first diffractive structure being a diffractive zone plate structure of a continuously curved surface, the first diffraction pattern will typically comprise one or more areas which are bright relative to other areas of the pattern which will appear to move relative to the reference point or line upon changing the viewing angle, e.g. appearing to "sweep" around a reference point. When such a bright feature meets the periphery of a first region, the strong contrast between the bright diffracted light inside the first region and the non-diffractive region of the device outside the first region highlights or emphasises the presence and shape of the indicia according to which that first region is formed. It will be appreciated that, in practice, the reference point or line of the first diffraction pattern (or part of it) could fall within outside the first regions and therefore may not be visible. Nonetheless, its position will still be apparent by virtue of the features of the first diffraction pattern which move around it upon tilting or rotation. It will be appreciated that the reference point or line will not appear to move from one first region to the other upon tilting; rather its position will remain static.

It should be noted that the first regions could each individually take the form of an indicia conveying an item of information, e.g. an alphanumeric character (or string of such characters), a symbol such as a currency identifier or a logo, or the array as a whole could convey an item of information, each first region being an indicia such as a line or geometric shape which is shaped and positioned so as to contribute to that item of information. The first regions need not be the same shape and/or size as one another, e.g. an array of different indicia could be presented. The first regions also need not be completely isolated from one another: provided the spacing is sufficient that the individual indicia can be discerned, narrow portions joining the first regions to one another (in which the first diffractive structure is present) will not detract significantly from the appearance of the device.

As will be appreciated by those familiar with diffractive devices, the term "zone plate structure" refers to a Fresnel-type arrangement of alternating bands of either high and low optical density (in a device operating on the principle of amplitude-difference) or high and low surface relief (in a device operating on the principle of phase-difference). In contrast to Fresnel structures with a high reflection efficiency, which typically give the appearance of a three-dimensional surface such as a mirror or lens, diffractive zone plate structures as used in the presently disclosed device have a low reflection efficiency (achieved inter-alia by appropriate sizing of the structure, e.g. having band-to-band spacings of the order of the wavelength of visible light, that is preferably less than 10 microns and more preferably less than 5 microns) and hence do not reconstruct an image of a 3D surface when viewed. Rather, different wavelengths are diffracted to different positions, resulting in a diffraction pattern which appears as a two-dimensional multi-coloured pattern, e.g. of spots of different colours, or "spread out" colours (when viewed under multi-chromatic illumination such as white light). It should be noted that zone plate structures are examples of "on-axis" diffraction structures and the first diffraction pattern will be visible at nearly all viewing angles (excluding highly oblique angles at which the device may act as a planar reflecting surface as will be the case for most diffracting structures). For example, the first diffraction pattern is preferably visible at tilt angles ($\theta$) from zero to at least 30 degrees in all azimuthal directions, more preferably from zero to at least 60 degrees, and most preferably from zero to at least 85 degrees.

Nonetheless, the diffractive zone plate structure itself is still generated based on a 3D surface and the nature of that surface will dictate the lateral shape of the bands (i.e. their shape in plan view, viewed along the normal to the device). For example, a zone structure of a hemi-sphere or another circular-based dome will comprise a series of concentric, circular bands centred on a point corresponding to the centre of the hemi-sphere. In the resulting diffraction pattern, a fixed reference point corresponding to the same centre position will be visible, other features of the diffraction pattern appearing to move relative to that reference point when the viewing angle is changed. In another example, a zone structure of a semi-cylinder will comprises a series of straight, parallel bands on each side of a straight line corresponding to the long central axis of the cylinder. This will result in an invariant reference line in the same position in the diffraction pattern, on each side of which the multi-coloured pattern will be visible and appear to move. In still further examples, the continuously curved surface on which the zone plate structure is based could be an ellipsoid, in which case the bands would be concentric ovals and there may be two reference points (at the two focus points of the ellipse), or a toroid, in which case the reference line will be curved (e.g. a circle). The continuously curved surface could alternatively comprise just a portion of any of the above shapes (e.g. an arc of a toroid), or could comprise two or more curved surfaces adjacent one another (e.g. a first semi-cylinder with its axis in a first direction adjacent a second semi-cylinder with its axis in a second, e.g. perpendicular, direction—in which case there will be two reference lines, one in each part of the device).

It should be appreciated that the above-described three-dimensional shapes will not be visible from the device but their selection will determine the nature of the first diffraction pattern and in particular the location and type of the reference point or line. In general, any continuously curved surface can be utilised, the only requirement being that the gradient of its surface changes continuously (i.e. there are no flat/planar portions of the surface—or if such portions exist they are not represented in the zone plate structure, e.g. they fall outside the bounds of the first diffraction structure and, preferably, of the whole device). If the diffractive structure is generated holographically, the curved surface in question will be used directly to produce the light interference pattern which is recorded and developed resulting in the first diffractive structure. In other cases, the curved surface may be used in a mathematical model to determine the light interference pattern that would result from it and then the corresponding structure can be formed based on the output of the model, e.g. using an optical fringe writer or electron beam lithography.

Preferred features of the disclosed device will now be described.

As already mentioned, the first diffractive structure could operate on differences in amplitude of light transmitted through the carrier or on differences in phase of the light. Hence, the diffractive zone plate structure preferably defines a series of alternating maxima and minima lines (i.e. the "bands" referred to above) which in the case of an amplitude difference zone plate structure correspond to locations of relatively high and relatively low opacity of the carrier layer, respectively, and in the case of a phase difference zone plate structure correspond to locations of peaks and troughs, respectively, in a surface relief of the carrier layer, the distance of the $n^{th}$ maxima line from the reference point along any one direction or from the reference line along the orthogonal direction being approximately proportional to the square root of n. Thus, as the distance from the reference point or line increasing, the spacing between each adjacent pair of maxima lines (bands) decreases. It should be noted that the proportionality constant may be the same in all directions (as would be the case in a circular zone plate structure), or could vary (e.g. in an elliptical zone plate structure).

In particularly preferred examples, the distance of the $n^{th}$ maxima line from the reference point along any one direction or from the reference line along the orthogonal direction is defined by the expression:

$$r_n = \sqrt{\left(n\lambda f + \frac{n^2\lambda^2}{4}\right)}$$

where n is an integer, $\lambda$ is the wavelength of light and f is a constant. The value of $\lambda$ is selected according to which wavelength(s) of illumination the pattern is to be viewed under. Hence the value of $\lambda$ should fall within the visible light spectrum, e.g. between about 390 to 700 nm. In preferred examples a value of around 550 nm is selected since this represents an approximate average of visible light wavelengths. Again in a circular-based device the same expression above will apply in all directions emanating from the reference point (i.e. "r"=radius), but in other devices the values of the constants $\lambda$ and f may differ. The above expression approximates to $r_n = \sqrt{(n\lambda f)}$ for $f \gg \lambda$. The preferred value off (which represents the focal length of the structure, if it were acting as a lens or mirror) is a matter of choice to the skilled man. In simple terms the focal length f represents the forward and reverse "depth" of the device. If the focal length f is much greater than half the lateral dimension of the optically active region of the security device then the forward and reverse focal spots (the bright regions discussed below) will swing outside the dimensions of the device as the viewing position moves away from the device normal. Conversely if the focal length is much less than half the lateral dimension of the optically active region of the security device then the sense of forward and reverse depth will be diminished.

Therefore it is preferred that the focal length f is similar in value to or less than half the lateral dimension of the optically active region of the security device. For example, for a security device with an optically active region of 30 mm in diameter, then suitable ranges for the focal length f would be between 10 mm and 30 mm. The choice of 10 mm will result in focal spots (bright regions) which remain within the dimensions of the device at even the most oblique viewing angles (greater than 75 degrees) but with a perceived forward and reverse depth noticeably less than the dimensions of the device, whereas 30 mm will give twice the perceived forward and reverse depth but the focal spots will swing or move out of view for viewing angles greater than 45 degrees.

It should be noted that the focal length f will vary with wavelength giving rise to chromatic aberration. For example, for a focal length at a wavelength of light of 550 nm (the centre of the visible spectrum) of 15 mm, then the focal length for red light (630 nm) will be about 13 mm and similarly for blue light (450 nm) it will be about 18 mm.

The variation between maxima and minima can follow profiles of various different shapes. Preferred examples include profiles which are substantially sinusoidal, square-wave or triangular, the angle of one face of each triangular maxima or minima increasing with distance from the reference point or line. However, substantially sinusoidal profiles are particularly preferred since this results in reduced diffraction efficiency which increases the spread of colours in the first diffraction pattern and therefore enhances the multi-coloured appearance of the device since each colour can be distinguished more clearly by the naked eye. It will be appreciated that where the structure is formed as a surface relief, the profile will correspond to the physical shape of the relief structure (i.e. that of the peaks/troughs, which will preferably be sinusoidal) whereas where the device is based on amplitude it will be the variation in optical density from one point to another which exhibits the (preferably) sinusoidal nature.

In particularly preferred examples, each maxima is spaced from the next by 10 microns or less, preferably 5 microns or less. Of course, this spacing will vary across the device but preferably falls within the above limits throughout.

Where the diffractive zone plate structure is an amplitude-difference zone plate structure, the maxima and minima bands can be formed by various different techniques, including demetallisation of the carrier. That is, maxima bands may carry a layer of metal (and hence have a high optical density), whilst the metal layer is absent in the minima bands (which therefore have a lower optical density). Some suitable methods of achieving a demetallised pattern with the necessary high resolution for this purpose are disclosed in US-A-2009/0317595. Amplitude-difference diffraction structures formed in this way are particularly difficult to counterfeit due to the complex technology involved, and therefore possess a particularly high level of security.

However, in many cases, it is especially preferred that the diffractive zone plate structure is a phase difference zone plate structure formed as a surface relief in the carrier layer, the diffractive security device preferably further comprising a reflection enhancing layer following the contours of the surface relief on the carrier layer. This enables large numbers of the device to be manufactured by replication of the appropriate surface relief, e.g. by embossing or cast-curing as discussed further below. The reflection enhancing layer could be a layer of one or more metals or metal-alloys (opaque or semi-transparent), preferably aluminium, copper, nickel or any alloy of one or more of the same, or could be a material with a different refractive index from that of the carrier layer (commonly termed a high refractive index or "HRI" material), such as ZnS. HRI layers have the advantage that many are visually transparent, with the result that the diffraction effects can be viewed whilst simultaneously seeing through the device.

Advantageously, the profile depth (i.e. peak to trough distance) of the surface relief defining the first diffractive structure is no greater than 1 micron, preferably no greater than 0.5 microns.

The array of first regions can take various different forms depending on the desired effect. Advantageously, the first regions should take up a large proportion of the overall surface area of the device in order that the device as a whole exhibits a bright effect with strong visual impact. Hence, preferably the proportion of the area of the device occupied by the first regions is at least 25%, more preferably at least 50%, still preferably at least 70%. The remaining area of the device could be wholly non-diffractive or could contain other diffractive elements as discussed further below.

Advantageously, the array of first regions should be configured to demonstrate register with the first diffractive structure, by arranging for the array to visually co-operate with the first diffraction pattern. For example, in particularly preferred embodiments, the array of first regions is centred on the reference point or line of the first diffraction pattern. Alternatively or in addition, the array of first regions may be symmetric about the reference point or line of the first diffraction pattern. It should be noted that the reference point or line of the first diffraction pattern may or may not itself be visible: it will only be exhibited if the portion of the first diffractive structure corresponding to the reference point or line (or part of such line) is contained within one of the first regions. It is preferable that this is the case, but not essential since even if the reference point or line is not visible, the various features of the first diffraction pattern will still appear to move relative to the same fixed location. This applies to all embodiments.

In a particularly preferred embodiment, the first regions are arranged along a plurality of lines, each line having a different, constant distance from the reference point or line of the first diffraction pattern, the lines preferably having the form of circles, ellipses or straight lines. For example, where the first diffractive structure is a circular Fresnel zone plate, the first regions may be arranged on a plurality of concentric circles centred on the reference point. In another preferred example, the first regions are arranged along a continuous line, the distance of the line from the reference point or line of the first diffraction pattern increasing continuously. For example, where the first diffraction pattern has a reference point (as opposed to a line), the first regions may be arranged along a spiral line centred on the reference point. In all of the above cases, each first region could be an elongate line or arc to emphasise the direction of the line pattern, or a series of dots, squares, stars or any other shapes could be used instead. In a particularly preferred case, each first region could comprise text and/or a number, such as "20 POUNDS", arranged to follow the lines.

In some especially preferred embodiments, the first regions are of increasing size with increasing distance from the reference point or line of the first diffraction pattern. This again serves to emphasise the visual integration between the first diffraction pattern and the indicia array.

The non-diffractive regions can be implemented in various different ways. In preferred embodiments, the non-diffractive regions may be substantially specularly reflective (e.g. a flat, reflecting surface) or may contain a light diffusing matt structure. The latter can be formed in the surface of the carrier as a further surface relief alongside the first diffraction structure. Where the carrier is provided with a reflection enhancing layer in the first regions to increase the visibility of the first diffraction structure, the reflection enhancing layer may be absent in the non-diffractive regions, in which case those regions may be transparent.

The non-diffractive region(s) could entirely fill the spaces between the first regions. However, in some preferred embodiments, the device further comprises one or more second regions in the form of indicia interspersed with the array of first regions and spaced from one another and from the first regions by the non-diffractive region(s), a second diffractive structure being present in the or each second region, the second diffractive structure being an off-axis diffractive structure configured such that when the device is illuminated by on-axis light a second diffraction pattern generated by the second diffractive structure can be viewed from at least the first side of the device at at least some off-axis viewing angles. Providing an additional, different diffractive effect in this way further increases the complexity of the device. The second diffractive structure could be of any type other than a zone plate structure. For example, the second diffractive structure could be an off-axis hologram or could comprise one or more diffraction gratings. The second regions could take the same form as the first regions, e.g. display the same indicia, or could be different. For instance, the first regions could each have the form of the word "TWENTY" or number "20" whilst the second regions could have the form of the word "POUNDS" or symbol "£".

In the case of both the first regions and (if present) the second regions, the indicia may preferably be any of: alphanumeric characters, currency identifiers, symbols, text, strings of digits, serial numbers, silhouette portraits or logos. As already mentioned, a mixture of such indicia may be present.

Devices of the sort described above can be provided with additional features to further enhance their security level. For example, the device may further comprise an at least semi-opaque image layer applied over the carrier layer on one or both of its sides defining an image which is registered to the reference point or line of the first diffraction pattern. The image layer may be formed of opaque or semi-opaque ink(s) for instance, and could be applied by any printing method. It should be noted that the image layer may not be in direct contact with the carrier layer but some intermediate layer may exist (such as the reflection enhancing layer mentioned above, or a lacquer layer).

Where the first diffractive structure (and the second diffractive structure, if present) are formed as a surface relief in the carrier layer and the diffractive security device further comprises a reflection enhancing layer following the contours of the surface relief on the carrier layer, the reflection enhancing layer may preferably include one or more gaps defining an image which is registered to the reference point or line of the first diffraction pattern. For example, if the reflection enhancing layer is a metal or alloy this may be achieved through a demetallising process such as etching. The gaps may or may not interrupt any of the first regions (and/or second regions, if present). No diffraction pattern will be visible in the one or more gaps, which will preferably appear transparent, possibly revealing a background on which the device has been placed.

Advantageously, images of the sort mentioned here (formed for instance by printing or demetallisation) should visually co-operate with the diffraction pattern(s) to help demonstrate the register. In preferred cases, the image substantially encloses, and preferably is centred on, the reference point or line of the first diffraction pattern.

In still further preferred examples, the device further comprises at least one transparent layer containing at least one optical effect substance, preferably a visible colourant, disposed over the carrier layer on one or both sides across at least part of the device. Such a layer can be provided to change the visible colour of the device (which will also affect the colours of the diffraction pattern), and/or to introduce luminescence, fluorescence or phosphorescence, e.g. as may be activated by UV illumination. The layer may be patterned, i.e. contain different optical effect substances in different laterally offset areas of the layer, to introduce further complexity to the device. The pattern may display indicia, a graphic or the like. Again this is preferably registered to the reference point or line of the first diffraction pattern.

Depending on the construction of the device the diffraction pattern(s) may only be visible from one side of the device, but in preferred embodiments, the construction is such that the diffraction effect is exhibited on both sides of the device. For example, where the diffraction structure is formed as relief in a reflective layer, the supporting layers on either side of the reflective layer may preferably be at least partially transparent so that it can be viewed from both sides.

Also provided is a security device assembly comprising a plurality of security devices each as described above, located in respective laterally offset areas, the first diffractive structure in each device being of a different continuously curved surface. For instance, the diffractive structure in each area could have a different degree of curvature and the set of surfaces could include a mixture of convex and concave surfaces. Since a plurality of first regions will still be provided in each area, the movement effect described above will again be visible from first region to first region within each area. However this movement effect will be different in the different respective areas thereby adding to the complexity of the resulting visual effect.

The present invention further provides a method of making a diffractive security device, comprising forming at least a first diffractive structure in a carrier layer, the first diffractive structure being an on-axis diffractive zone plate structure of a continuously curved surface configured such that when the device is illuminated by on-axis light a first diffraction pattern generated by the first diffractive structure can be viewed from at least a first side of the device at substantially all viewing angles, the first diffraction pattern exhibiting a reference point or reference line relative to which other features of the first diffraction pattern appear to move when the viewing angle is changed;

wherein the device has an array of first regions in the form of indicia in each of which a part of the first diffractive structure is present, the first regions being spaced by one or more non-diffractive regions of the device, wherein each of the first regions exhibits a portion of the first diffraction pattern;

such that upon changing the viewing angle in a continuous sense, features of the first diffraction pattern appear to move from one first region to the next so as to highlight and/or reveal different indicia of the array.

The resulting security device provides all the benefits already mentioned above.

In preferred embodiments, the first and second diffractive structures are formed by:
providing a replication tool having a surface relief defining the first diffractive structure; and
using the replication tool to form the surface of the carrier layer according to the surface relief, and preferably
applying a reflection enhancing layer onto the carrier layer so as to follow the contours of the surface relief.

The replication tool may be manufactured by creating the surface relief in a recording medium layer and preferably transferring the surface relief to the surface of the replication tool. This could be performed as part of the above process but more typically is carried out as a separate preliminary step, potentially by a different entity and/or at a different manufacturing site.

In preferred examples, the surface relief is created in the recording medium layer by forming a first surface relief structure corresponding to the first diffractive structure and then in the non-diffractive region(s) of the device destroying the first surface relief structure. In the non-diffractive region(s), the surface relief may be destroyed entirely leaving a planar surface which is substantially specularly reflective, or could be replaced by a non-diffractive surface relief such as a matt, light-diffusing structure.

The first relief structure could be made using various different techniques. Particularly good results have been achieved where the first surface relief structure is holographically generated by exposing the recording medium layer to a light interference pattern from the continuously curved surface. This results in a structure with a low diffraction efficiency and thus increased angular spread between the different colours in the diffraction pattern. In this case, rather than form the first diffractive structure across the whole device and then destroy portions of it, another more preferred option is to expose the recording medium layer to the light interference pattern from the continuously curved surface through a patterned mask defining the array of first regions. This enables both the first diffractive structure and the array of indicia to be formed in a single exposure step. In still further preferred embodiments, the first surface relief structure may be formed in first regions only of the recording medium layer using an optical fringe writer or electron beam lithography.

As mentioned above, the device may additionally comprise a second diffractive effect and hence preferred implementations of the method further comprise forming a second diffractive structure in one or more second regions in the form of indicia interspersed with the array of first regions and spaced from one another and from the first regions by the non-diffractive region(s), the second diffractive structure being an off-axis diffractive structure configured such that when the device is illuminated by on-axis light a second diffraction pattern generated by the second diffractive structure can be viewed from at least the first side of the device at at least some off-axis viewing angles.

The second diffractive structure can be created by various different techniques. In some preferred embodiments, the second surface relief structure is holographically generated by exposing second regions of the recording medium layer to a light interference pattern from an off-axis transmission hologram. In other preferred embodiments, the second surface relief structure is formed using an optical fringe writer or electron beam lithography.

The method can be adapted to include any of the preferable features described above. Hence in one preferred embodiment the method further comprises applying an at least semi-opaque image layer over one or both sides of the carrier layer, defining an image which is registered to the reference point or line of the first diffraction pattern. For instance this can be applied using any suitable printing technique such as gravure, lithographic, offset or flexographic printing.

The method may further comprise patterning the reflection enhancing layer to form gaps defining an image which is registered to the reference point or line of the first diffraction pattern. For example where the reflection enhancing layer is metal or metal alloy, this may comprise a demetallisation process, e.g. via the use of soluble inks and/or by etching, possibly using a patterned resist.

The method may further comprise applying at least one transparent layer containing at least one optical effect substance, preferably a visible colourant, disposed over the carrier layer on one or both sides across at least part of the device. As discussed previously the layer could carry a pattern. Any suitable printing or coating technique could be employed to create the layer.

The present invention also provides a security device made in accordance with the above method.

Also disclosed is a security article comprising a security device as already described, preferably a thread, stripe, patch, foil, transfer foil or insert.

The present invention also provides a security document comprising a security device as already described, or a security article as already described, the security document preferably comprising a banknote, identity document, passport, cheque, visa, license, certificate or stamp.

Examples of security devices, methods of manufacture thereof, and their application to security documents, will now be described with reference to the accompanying drawings, in which:

FIG. 1 shows an example of a first diffractive structure suitable for use in embodiments of the invention, in plan view;

FIGS. 2(a), (b) and (c) show three exemplary profiles of the first diffractive structure of FIG. 1 along a radial cross-section, the profile denoting the height of the diffractive structure in one embodiment, or the transparency of the diffractive structure, in another embodiment;

FIGS. 3(a) and (b) are two images of an exemplary first diffraction pattern exhibited by a diffractive structure such as that shown in FIG. 1, under ambient illumination, at two different viewing angles;

Figure 7:
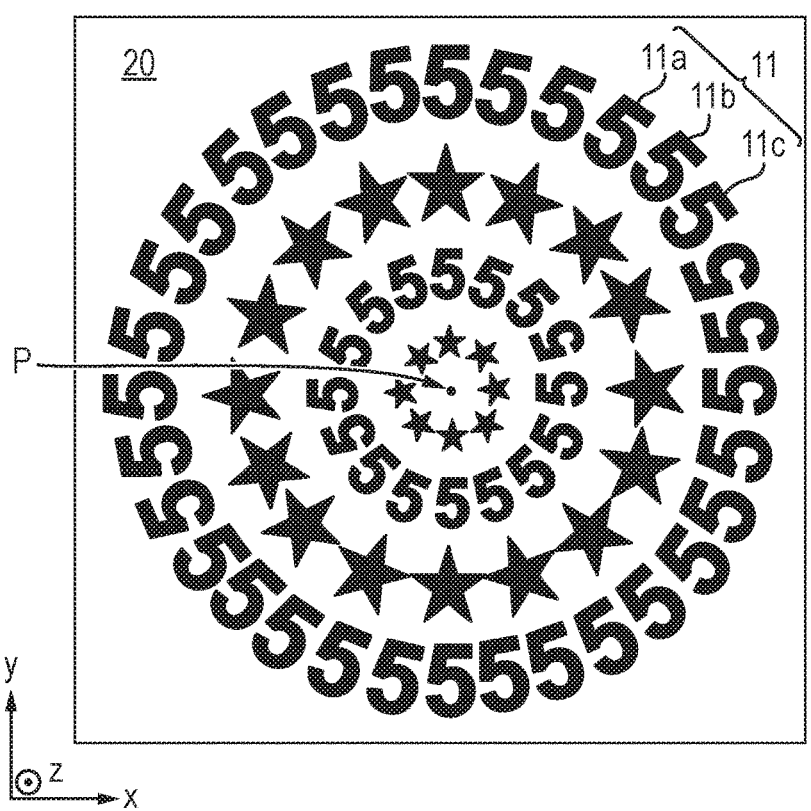
Figure 8A:
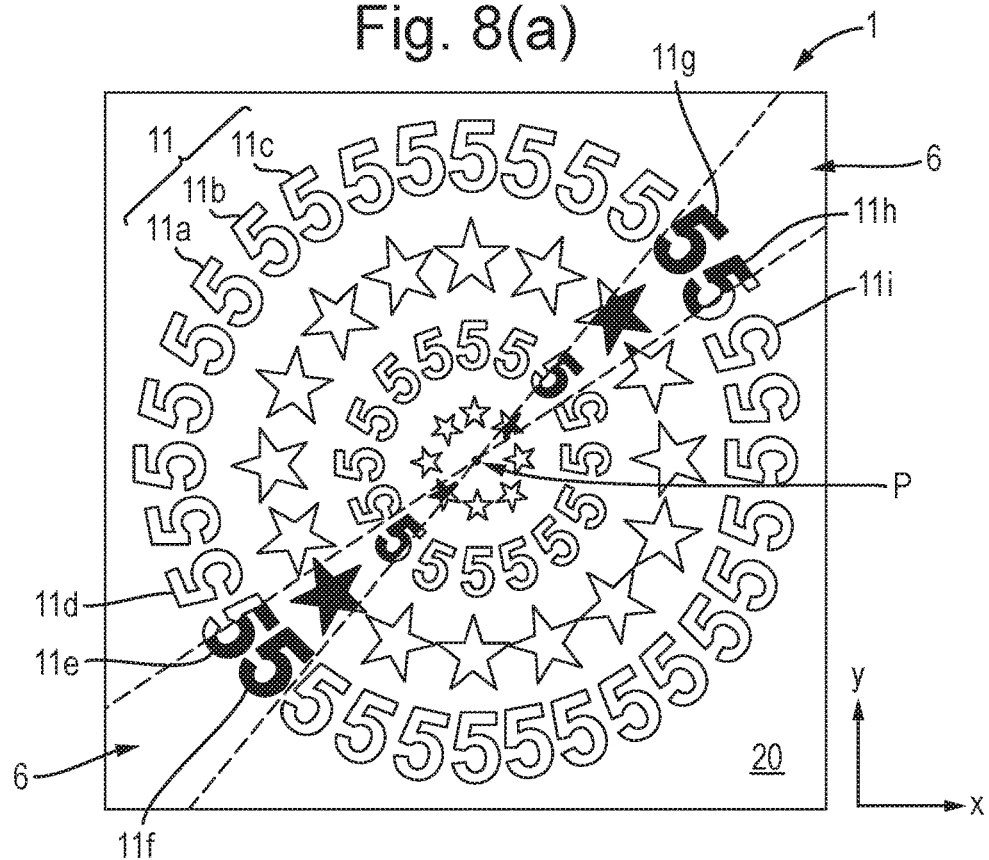
Figure 8B:
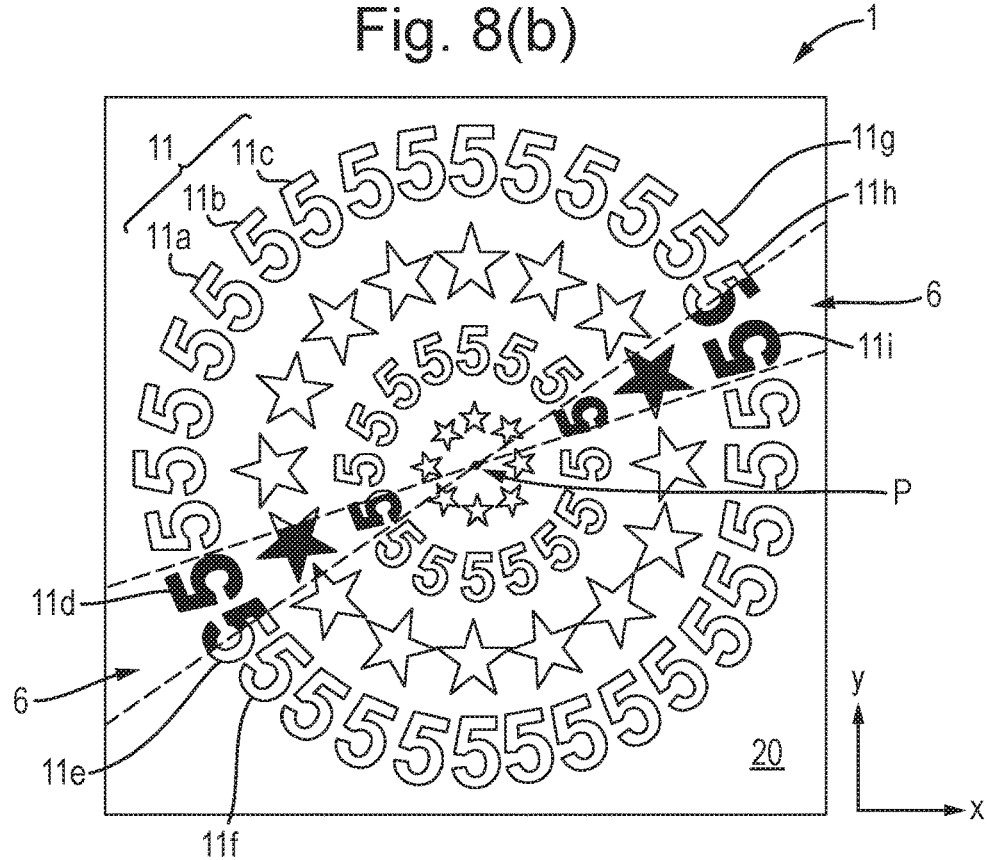
Figure 9A:
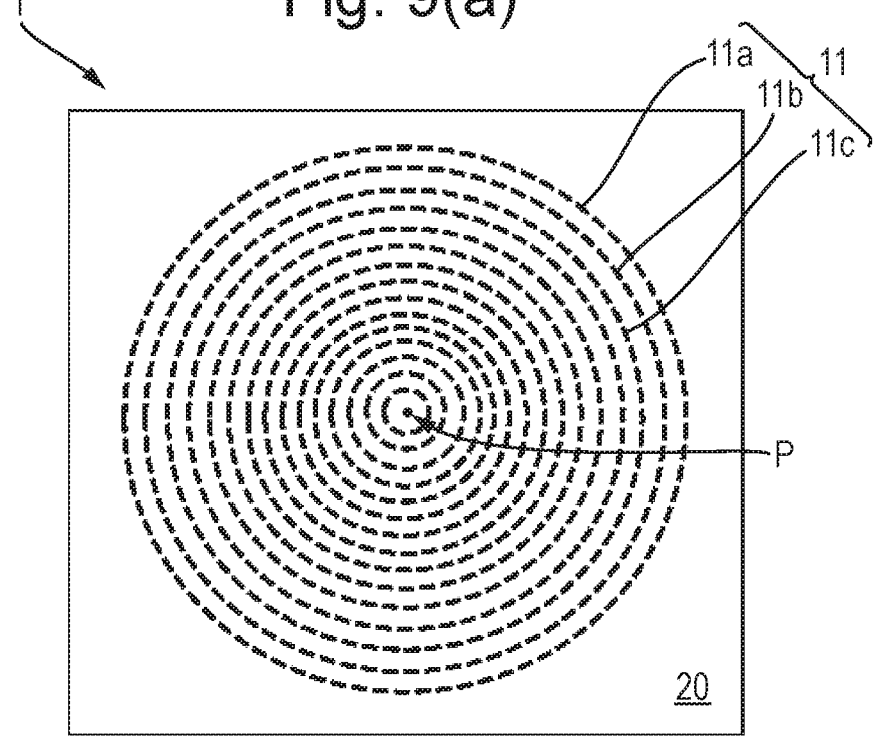
Figure 9B:
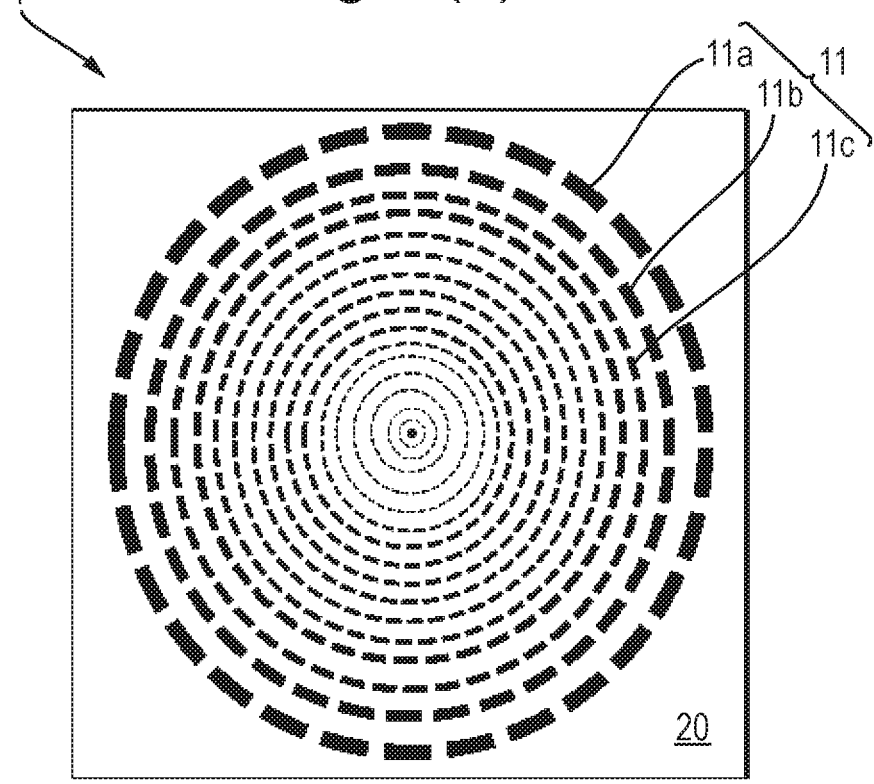
Figure 10A:
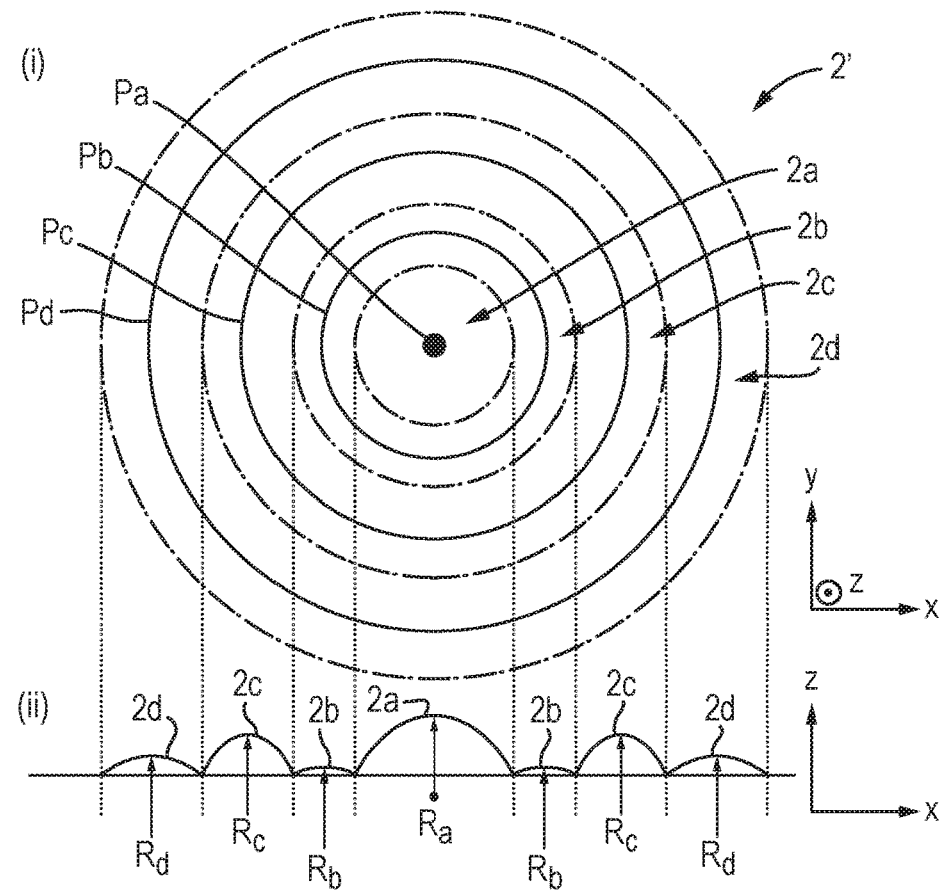
Figure 10A:
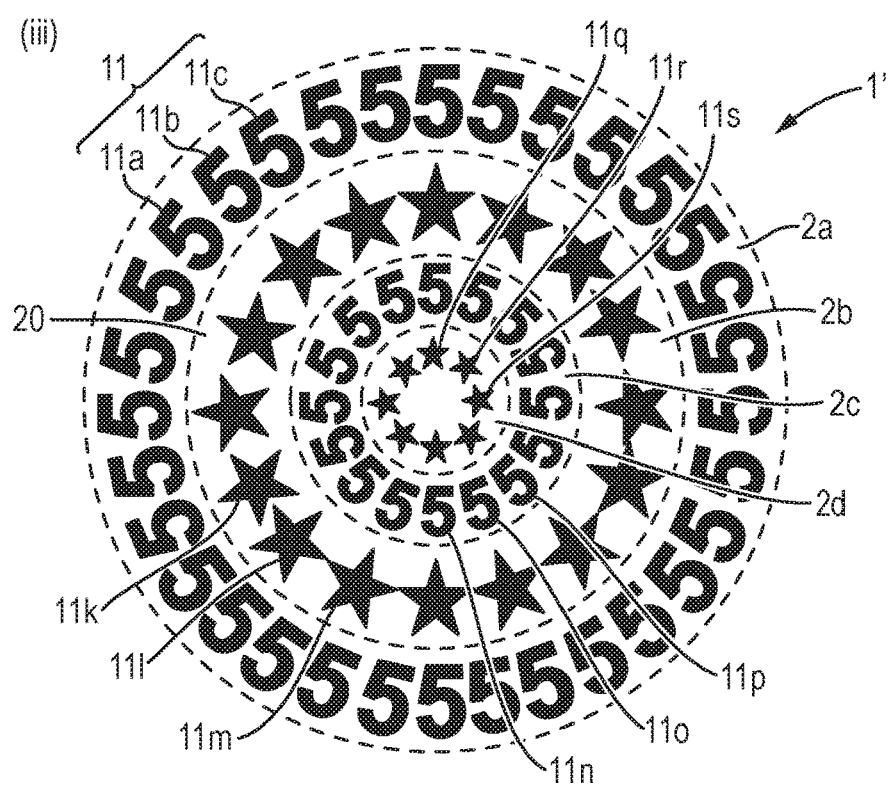
Figure 10B:
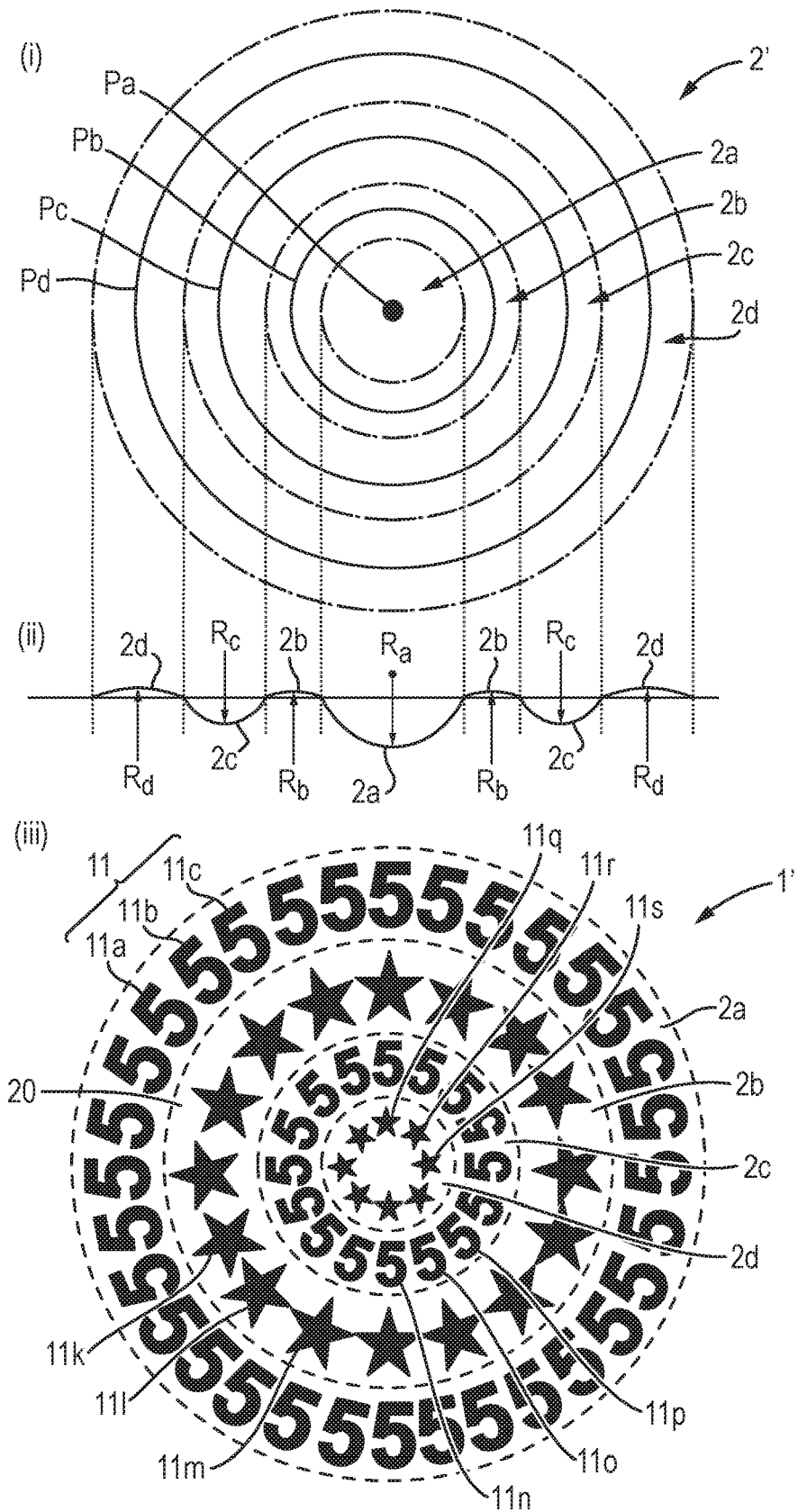
Figure 11:
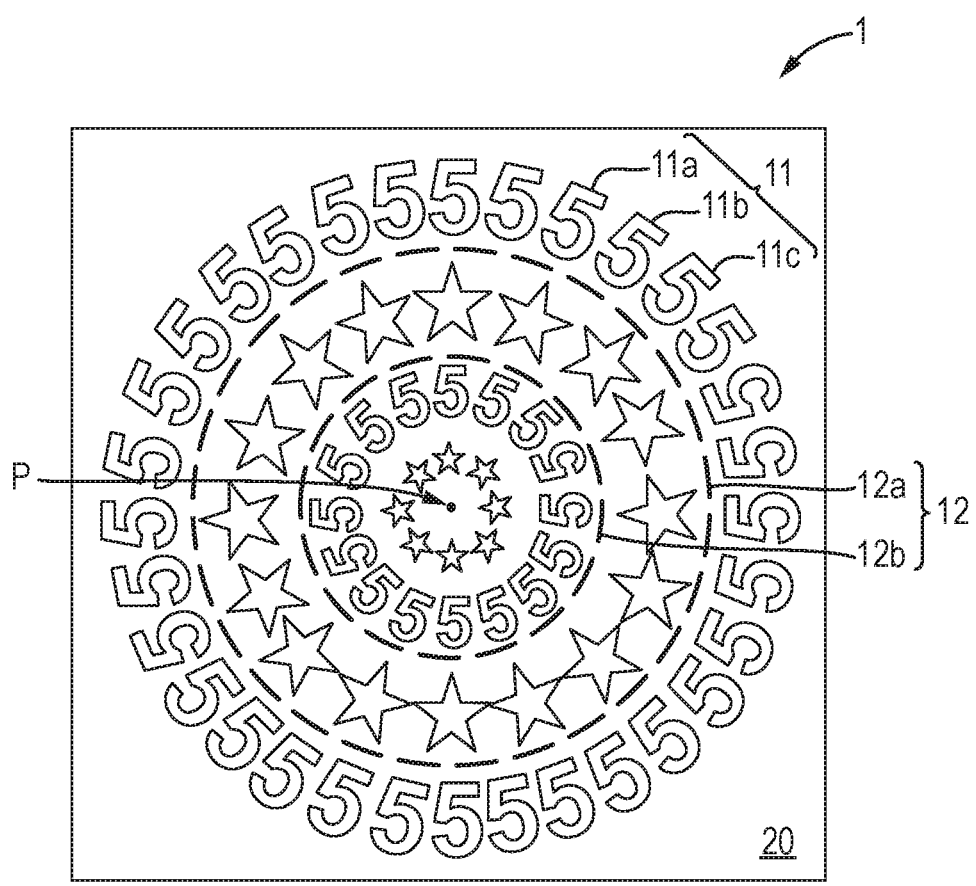
Figure 12:
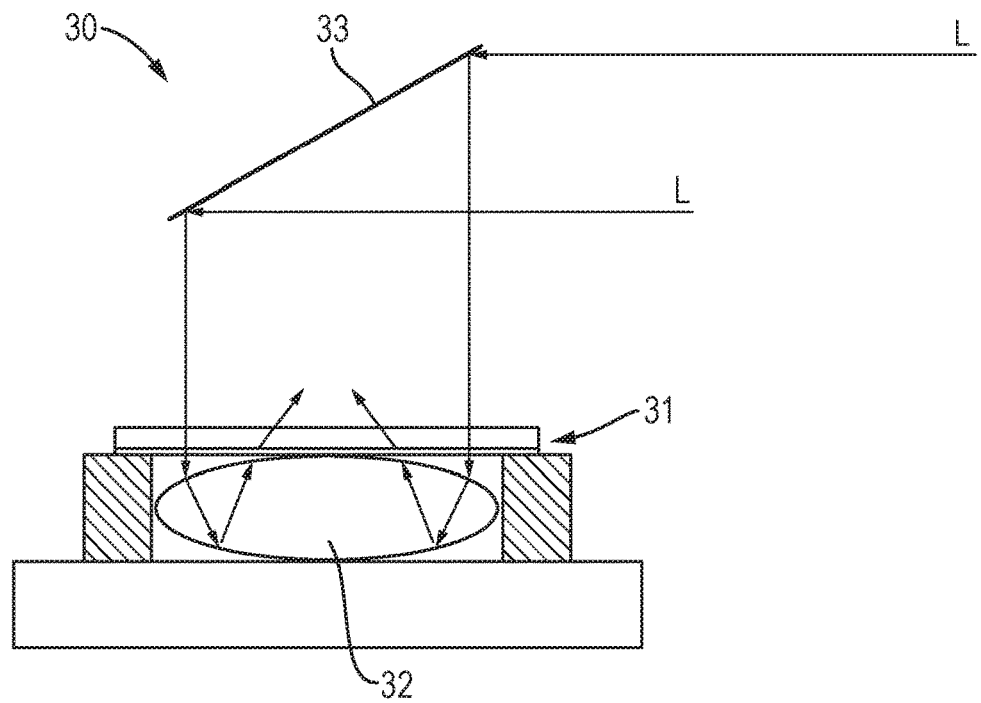
Figure 13:
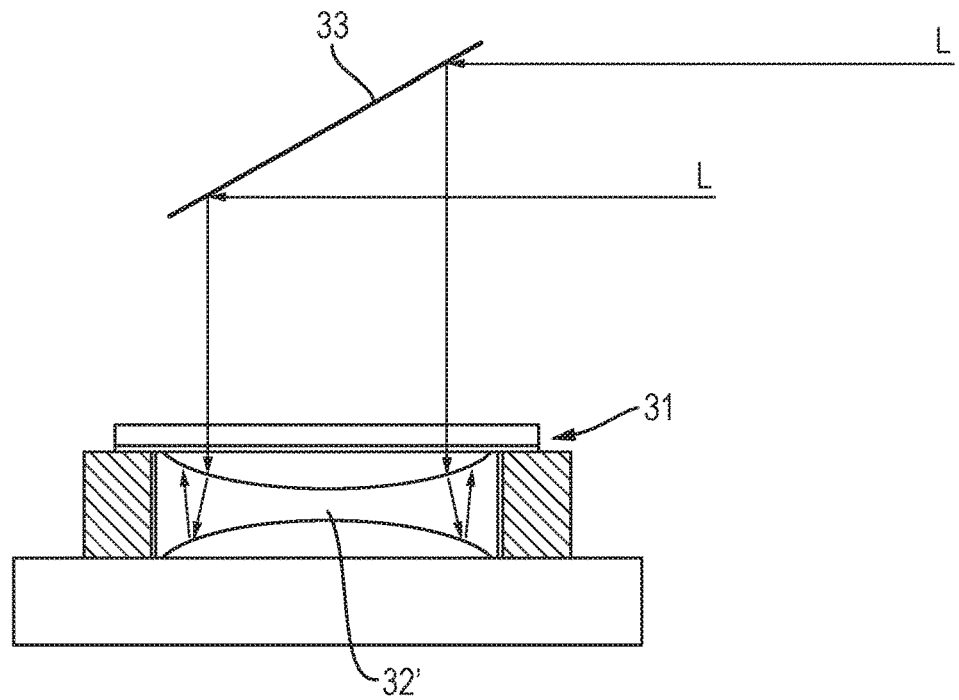
Figure 14:
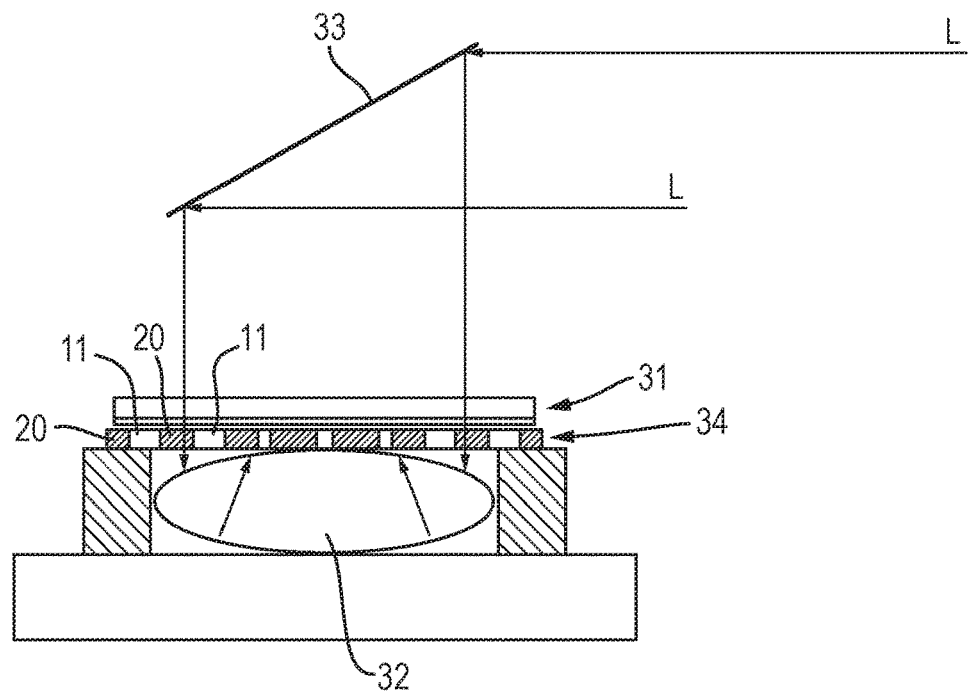
Figure 15A:
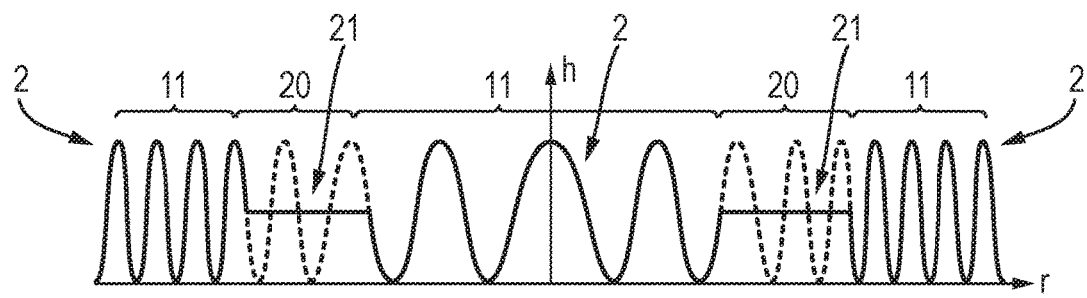
Figure 20A:
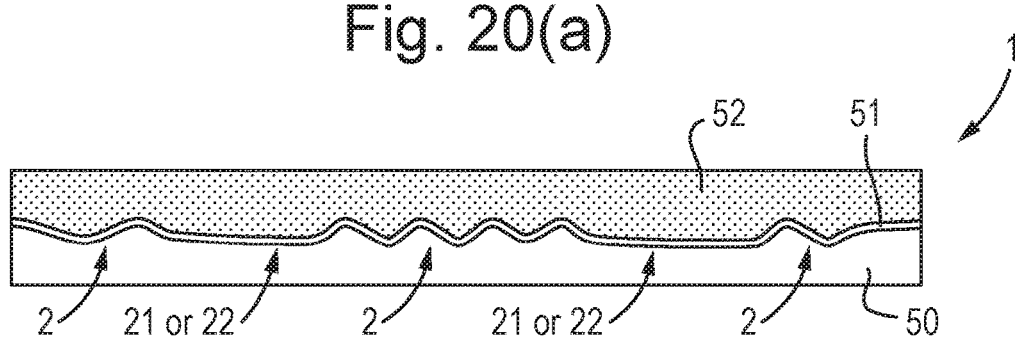
Figure 20B:
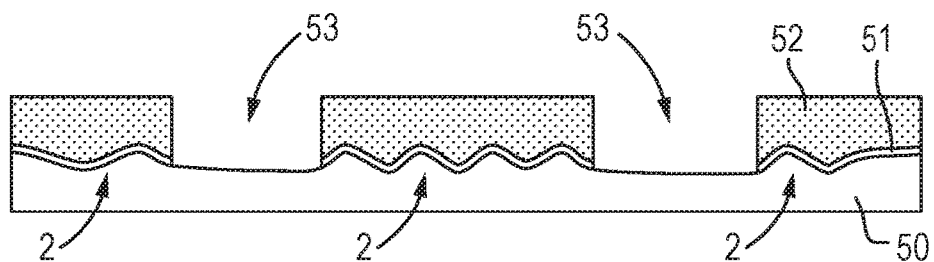
Figure 20C:
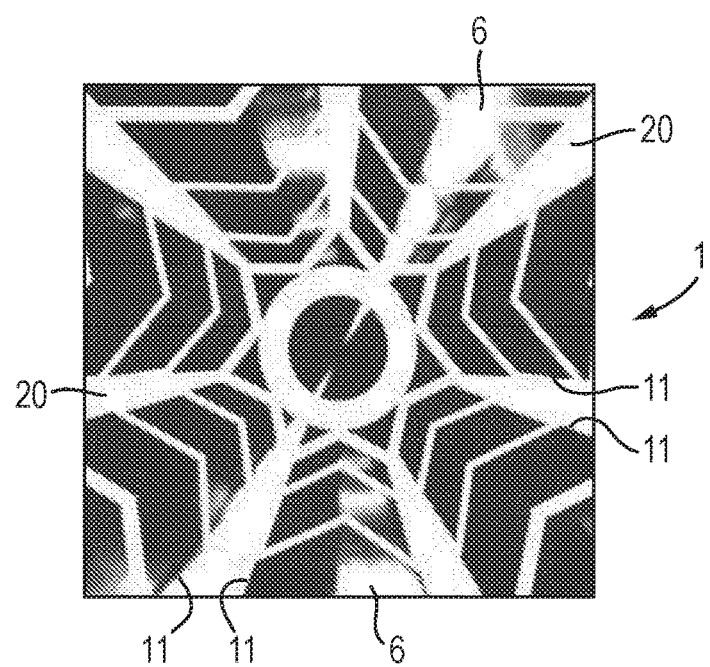
Figure 21A:
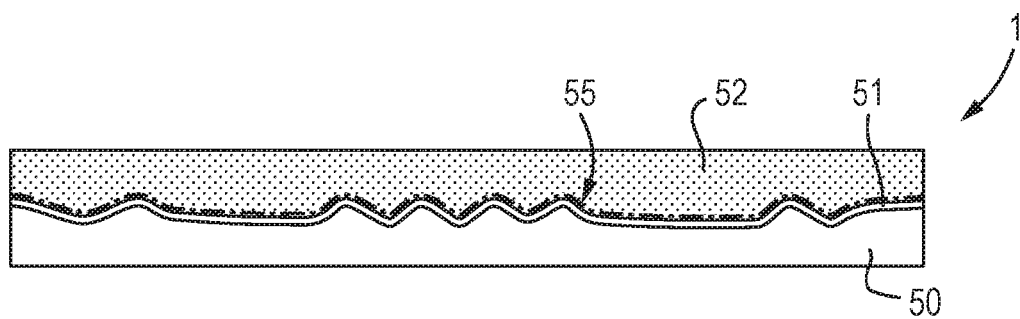
Figure 21B:
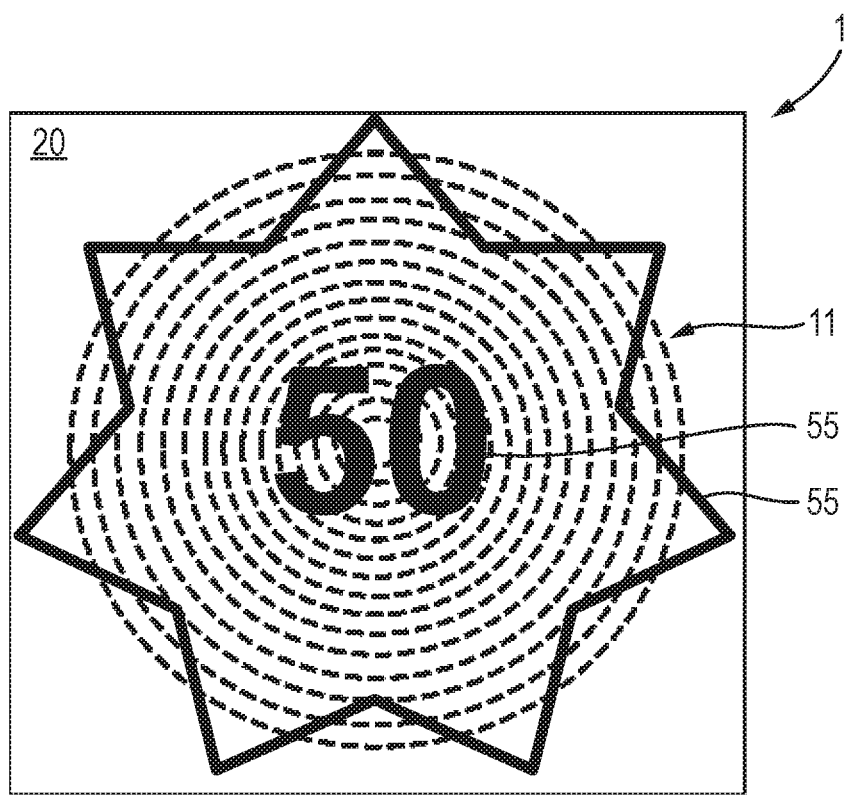
Figure 22A:
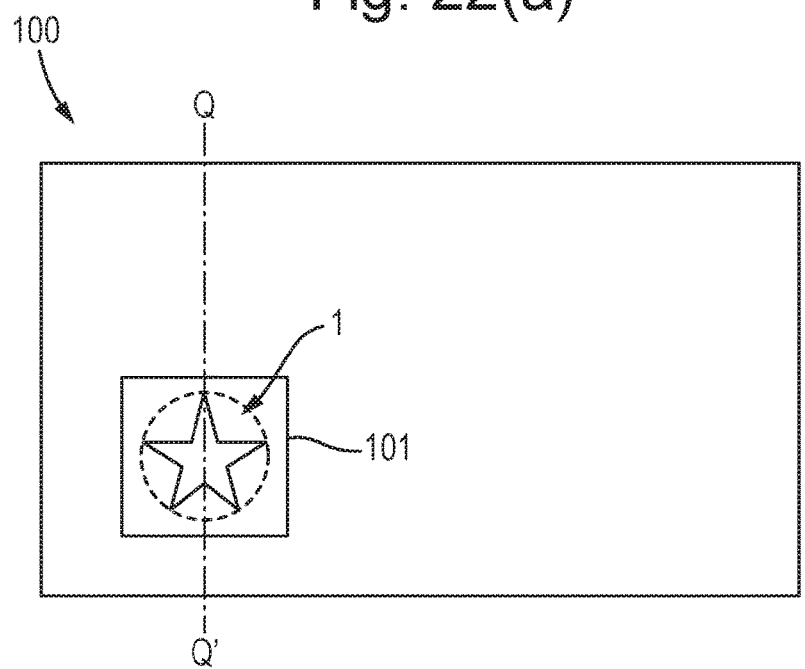
Figure 22B:
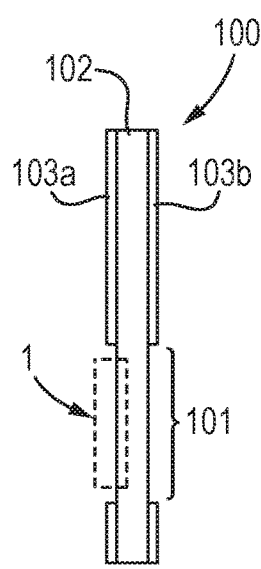
Figure 23C:
Figure 23B:
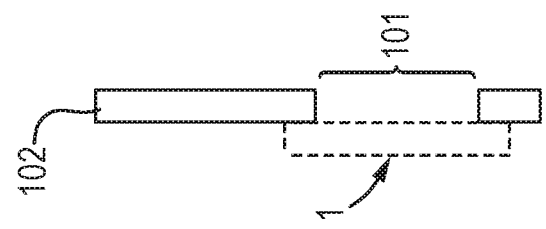
Figure 23A:
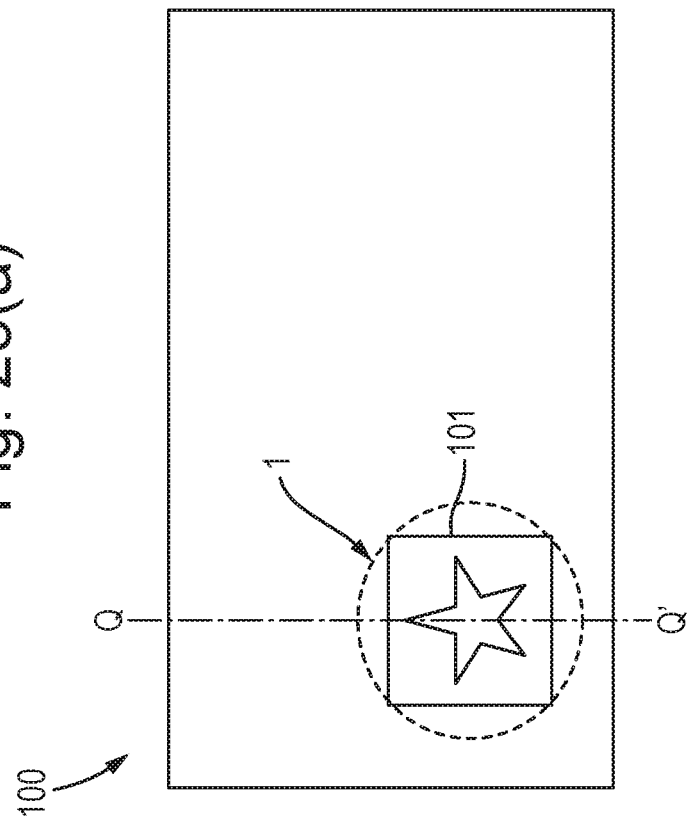

FIGS. 7 and 8 schematically depict a first embodiment of a security device, FIG. 7 showing the arrangement of first regions across the device, and FIGS. 8(a) and (b) each showing a view of the device from a different respective viewing angle;

FIGS. 9(a) and 9(b) respectively show second and third embodiments of a security device, each showing schematically the arrangement of first regions across the device;

FIGS. 10(a) and 10(b) depict two embodiments of a security device assembly, each showing (i) a schematic representation of the first diffraction structures in plan view; (ii) a representation of the curved surfaces forming the first diffraction structures, along a cross section through the centre of the first diffraction structures; and (iii) a plan view illustrating schematically the arrangement of first regions across the device;

FIG. 11 shows another embodiment of a security device, showing schematically the arrangement of first regions;

FIGS. 12 and 13 show two exemplary arrangements for holographically generating a first diffractive structure;

FIG. 14 shows a further exemplary arrangement for holographically generating a first diffractive structure in first regions of the device;

FIGS. 15(a) and (b) show cross-sections through two embodiments of security devices;

FIGS. 16 to 19 schematically depict four exemplary techniques for forming the diffractive structure(s);

FIGS. 20(a) and (b) show cross-sections through two further embodiments of security devices, FIG. 20(c) showing an embodiment of a security device in plan view;

FIG. 21(a) shows a cross-section through a further embodiment of a security device and FIG. 21(b) shows the security device in plan view; and FIGS. 22, 23 and 24 show three examples of security documents provided with exemplary security devices.

Security devices of the sort disclosed herein comprise a first diffractive structure 2 in the form of a diffractive zone plate structure, arranged in spaced regions of the device (referred to as "first regions" hereinafter). Diffractive zone plates are structures comprising a series of alternate bands (i.e. maxima and minima) symmetric about a point or line, the spacing of adjacent bands decreasing with distance away from the point or line in accordance with a predetermined relationship, described further below. The bands may take the form of alternating high and low optical densities (e.g. opaque bands spaced by transparent bands), in which case the diffractive effect will operate on the principle of amplitude-difference, or physical peaks and troughs forming a surface relief, in which case the structure will be a phase-difference diffractive device. In both cases the structure will be formed in or on a carrier, such as a layer of lacquer or resin. Where the structure is formed as a surface relief on the carrier, preferably a reflection-enhancing layer (such as metal or a high refractive index material) will be applied so as to follow the contours of the relief, to improve its visibility.

Figure 1:
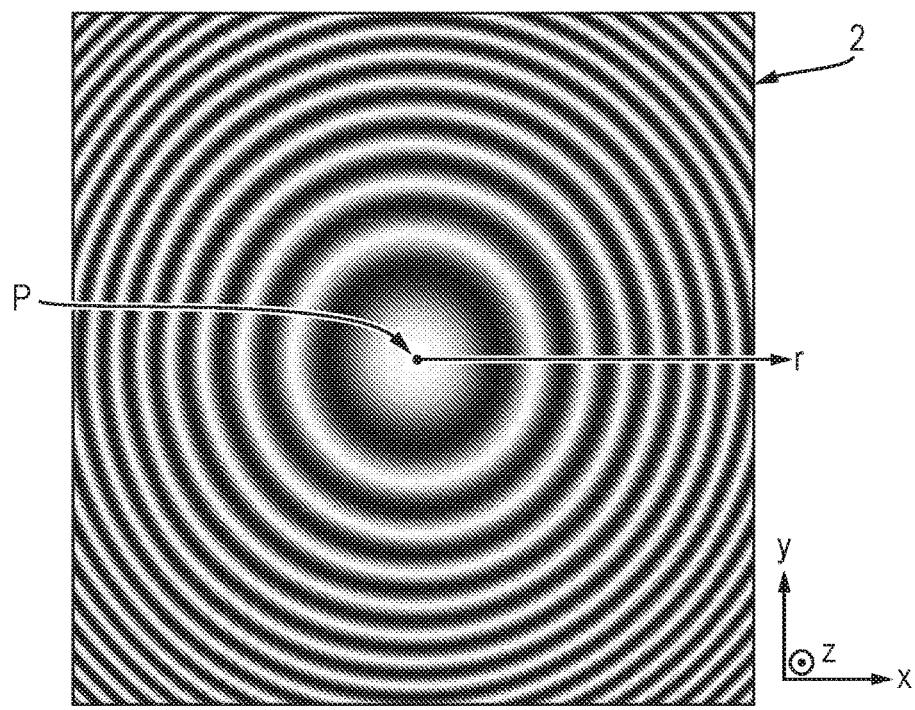

The zone plate structure is based on a three-dimensional surface and the shape of that surface will determine the lateral shape of the bands in the zone plate structure. FIG. 1 shows a first example of a diffractive zone plate structure 2 in plan view which is suitable for use as the first diffractive structure in embodiments of the invention. It will be seen that the structure comprises a series of concentric circular dark bands spaced by light bands, all centred on point P and their spacing decreasing with increasing radius r. Depending on the type of device, the dark bands may represent areas of high optical density whilst the light bands represent transparent areas, or the dark bands may represent troughs and the light bands peaks in a surface relief. A zone plate structure comprising circular bands of this sort will be generated from a portion of a spherical surface, such as a hemi-sphere, or another circular-based dome-shaped surface. In general, the zone plate structure forming the first diffractive structure in the disclosed device can be based on any continuously curved three-dimensional surface, i.e. one having a constantly changing surface gradient without any flat portions, and alternative examples will be given below. The structure should preferably continue all the way to the edge of the device, as shown.

Diffractive zone plate theory states that the distance of the $n^{th}$ band from the point P will be governed by the expression:

$$r_n = \sqrt{\left(n\lambda f + \frac{n^2\lambda^2}{4}\right)}$$

where n is an integer (n=1, 2, 3, . . . ), $\lambda$ is a wavelength of visible light (e.g. 550 nm) and f is a constant. Since the constant f will generally be selected to be much greater than the wavelength of light, the above expression approximates to $r_n=\sqrt{(n\lambda f)}$, i.e. the distance of each band is proportional to the square root of its number in the sequence of bands. As discussed above, in preferred embodiments the value of f is selected to be comparable to the lateral dimension of the optically active area of the device and will therefore typically be of the order of several millimetres or tens of millimetres.

If the spacing of the bands were large relative to the wavelength of light, the device would operate as a Fresnel lens or mirror through the action of geometrical refraction or reflection (i.e. not diffraction). However in the presently disclosed device, the spacing of the bands is comparable to the wavelength of visible light (preferably 10 microns or less, more preferably 5 microns or less) with the result that diffraction effects dominate and different wavelengths are redirected by the structure by differing amounts. As such, the device does not reconstruct the appearance of the three-dimensional surface on which it is based but rather exhibits a diffraction pattern of rainbow-coloured regions (assuming the device is illuminated by multi-chromatic, e.g. white, light) which, upon changing the viewing angle, appear to move relative to a fixed point corresponding to the centre P of the diffractive structure, as will be described further below with respect to FIG. 3.

Figure 2A:
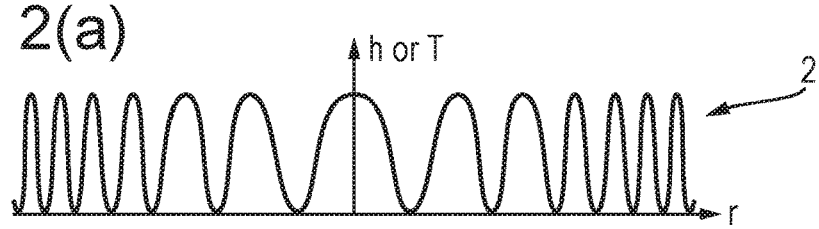
Figure 2B:
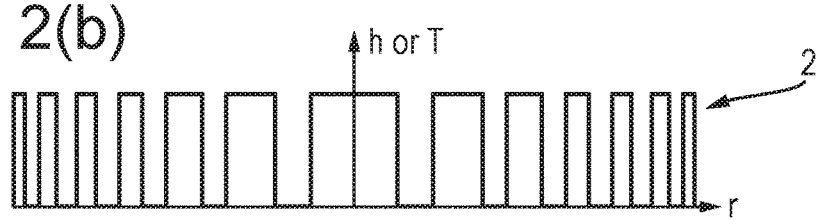
Figure 2C:
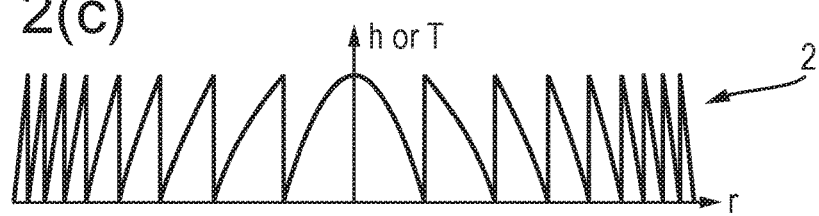

FIGS. 2(a), (b) and (c) show three alternative profiles of the zone plate structure shown in FIG. 1 along a radial direction (not to scale). The vertical axis may represent physical height h (in the case of a phase-difference device) or optical transparency T (in the case of an amplitude-difference device). It will be seen that various different profile shapes could be employed. In FIG. 2(a) the band profile is substantially sinusoidal. This is strongly preferred since this results in lower diffraction efficiency and hence greater angular spread of the different wavelengths, meaning a brighter and more colourful diffraction pattern is exhibited. However, the structure could alternatively have a square-wave profile as shown in FIG. 2(b), or a triangular profile as shown in FIG. 2(c), both of which would lead to higher diffraction efficiency such that the diffracted light will be more closely focussed. In the case of the triangular profile shown in the FIG. 2(c) it will be noted that the outer flank of each triangular "peak" is curved and its gradient increases with increasing radius r. In combination, the outer flanks of the peaks in FIG. 2(c) reconstruct the shape of the spherical surface on which the zone structure is based, as in conventional (reflective/refractive) Fresnel structures.

The ensuing description will focus on diffraction structures formed as a surface relief (i.e. phase-difference devices rather than amplitude-difference devices) since these lend themselves well to large volume replication. Exemplary methods for forming the first diffraction structure will be discussed below.

Figure 3A:
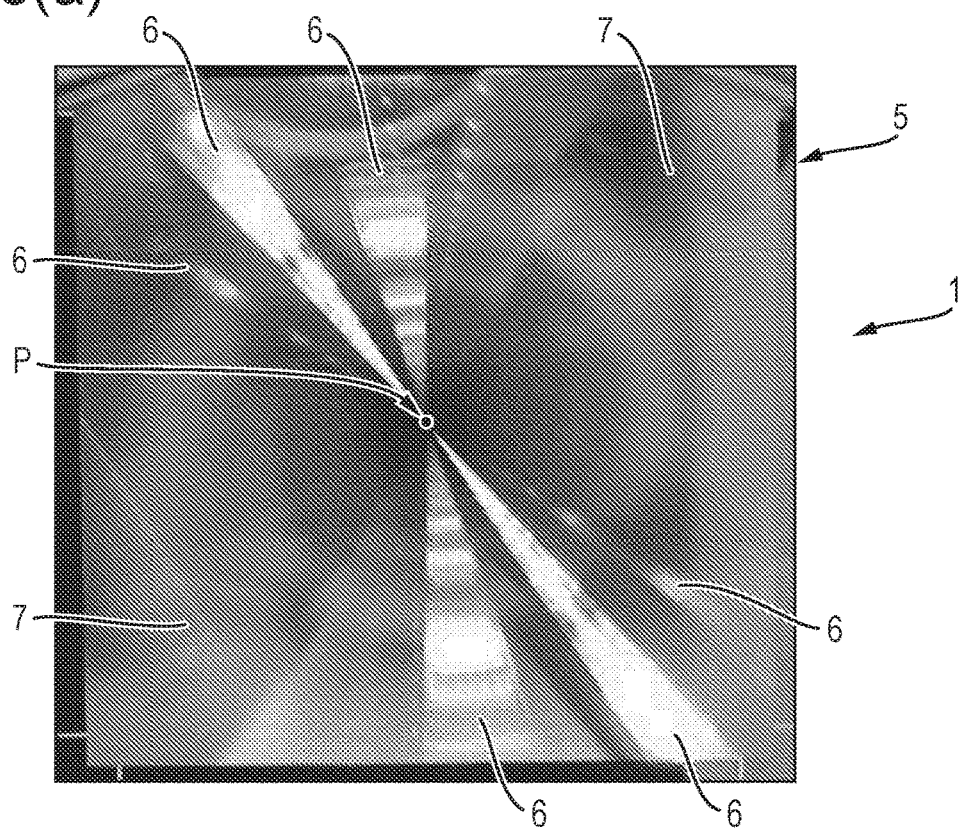
Figure 3B:
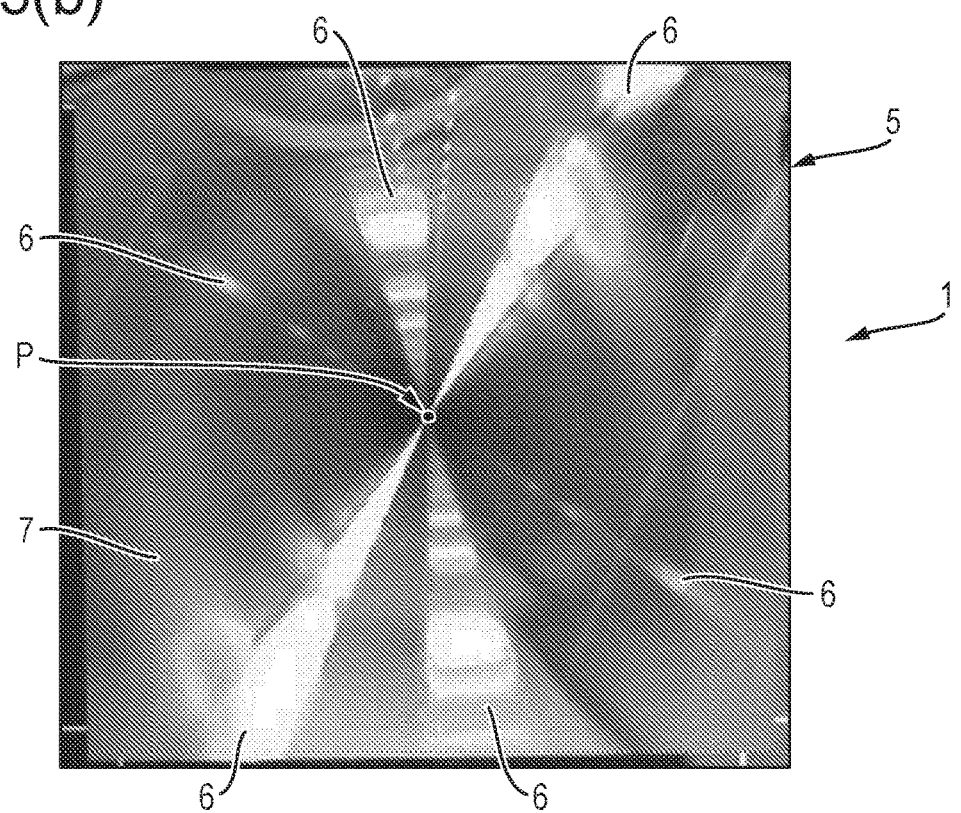

FIGS. 3(a) and (b) are images showing the appearance of the first diffraction pattern 5 exhibited by a first diffractive structure 2 of the sort shown in FIG. 1 when illuminated by white light. The first diffraction pattern will be visible at substantially all viewing angles (i.e. over essentially the whole viewing hemisphere), but its appearance will vary upon changes in tilt angle about the x- or y-axes. Thus, FIG. 3(a) shows the appearance of the first diffraction pattern 5 at a first viewing angle, and FIG. 3(b) shows its appearance at a second, different viewing angle. Since in this example the first diffraction structure is rotationally symmetric, the light image presented to the viewer will appear constant and invariant when the device is simply rotated about the z-axis (azimuthal axis) without any change in tilt angle (see FIG. 6 below for definitions of these angles), although the diffraction pattern is still moving with respect to the reference frame of the carrier. Since the device will always have some identifiable reference feature (such as a corner of the carrier, an article to which the carrier is attached or even the point at which the user is holding the device), this will be apparent as relative motion between the diffraction pattern and that reference feature since the pattern will appear to stay stationary as the object displaying it is rotated.

It will be seen that the diffraction pattern comprises one or more bright areas 6 and a background 7 which is less bright and more blurred. Whilst the Figures are necessarily shown in greyscale, it should be appreciated that the real appearance is multi-coloured, each of the bright portions 6 displaying a rainbow spectrum of different colours (possibly with multiple repeats) emanating from the point P towards the edge of the device 1. The bright portions 6 can be described as forward-projecting and reverse-projecting light beams whose boundaries trace out a spherical surface around the device with a radius equaling the constant f in the expression given above. As the viewing angle is changed, e.g. by tilting and/or rotating the device 1, the bright areas 6 appear to move relative to the point P, e.g. rotating about it and/or changing in apparent length or colour. This can be appreciated by comparing the positions of the bright areas 6 between FIGS. 3(a) and 3(b). The point P, meanwhile, remains fixed and is therefore referred to hereinafter as the reference point.

Figure 4:
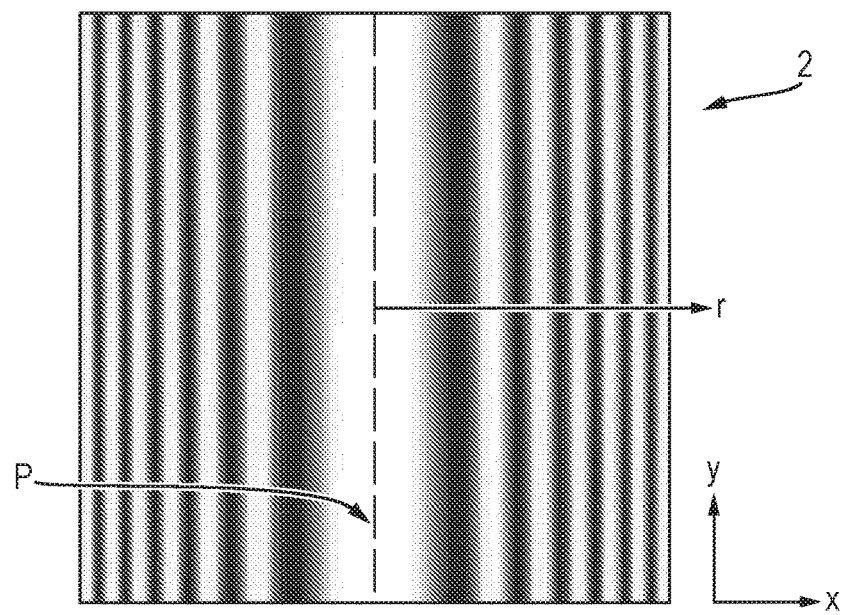
FIGS. 4 and 5 show two further examples of first diffractive structures, in plan view.

Diffractive zone plate structures based on surfaces with circular curvature, such as those depicted in FIGS. 1 and 3, are particularly preferred for use in the presently disclosed devices. However, alternative zone plate structures that could be used include those based on cylindrical surfaces, ellipsoids, toroids, or any portion thereof. FIG. 4 shows an example of a zone plate structure 2 based on a cylindrical surface, the long axis of the cylinder being aligned with the y-axis. The structure 2 comprises a series of spaced bands as before, except here they are straight and parallel to one another. The structure is symmetric about line P which corresponds to the central axis of the cylinder, and the spacing of the bands decreases with distance r from the line P in accordance with the same relationship already described above. The resulting diffraction pattern will be similar to that shown in FIG. 3 except here the bright portions 6 will appear to emanate from along the whole length of reference line P, covering rectangular or parallelogram-shaped areas of the device which vary depending on the viewing angle. Again, the line P will be discernible as a fixed line in the diffraction pattern relative to which other features of the pattern move on tilting of the device. However since the curvature of the cylinder is only in one axis, the movement will only be apparent upon tilting in the direction of the axis and not upon tilting in the perpendicular direction.

Figure 5:
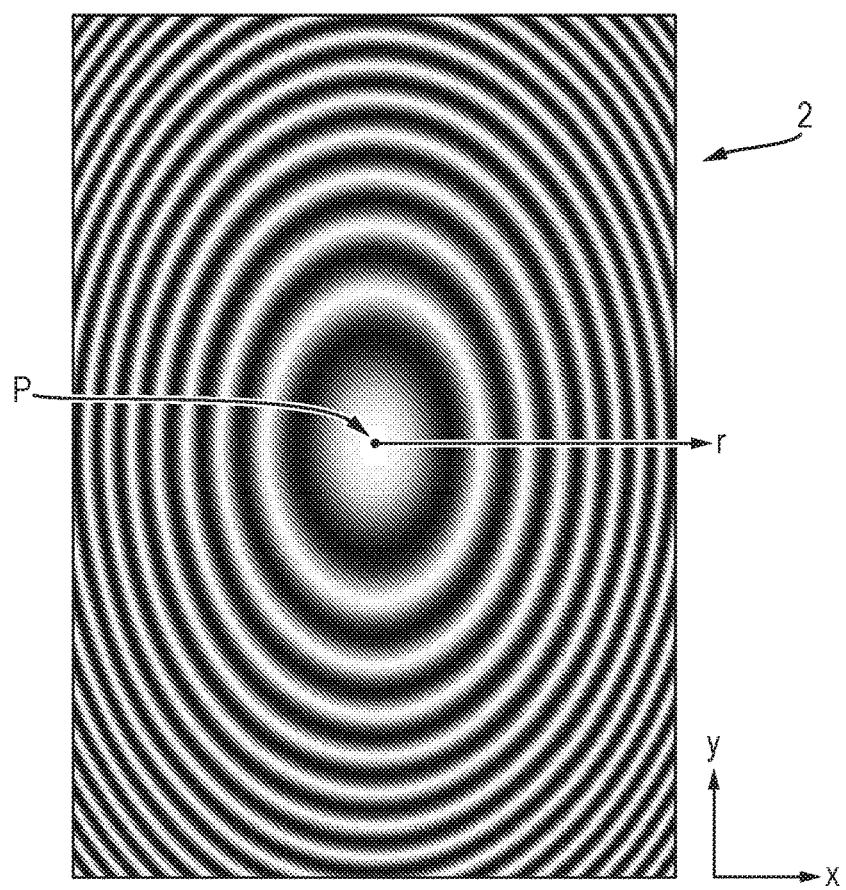

FIG. 5 shows an example of a zone plate structure 3 based on an ellipsoid, having its long axis aligned with the y-axis and its short axis aligned with the x-axis. The structure 2 again comprises a series of spaced bands in the form of concentric ellipses centred on point P. The spacing of the bands is again governed by the expression given above, but here will also vary depending on the direction of r (i.e. the constant f in the above expression will have different values along the x- and y-axes, and each direction inbetween). The resulting diffraction pattern will be similar to that of FIG. 3, except for a corresponding elliptical distortion. Again, the point P will act as a fixed reference point.

Combinations of curved surfaces could also be used, e.g. two abutting cylindrical surfaces with different directions of their long axes (preferably orthogonal directions). In this case at least one portion of the device would exhibit movement upon tilting in any direction.

Figure 6:
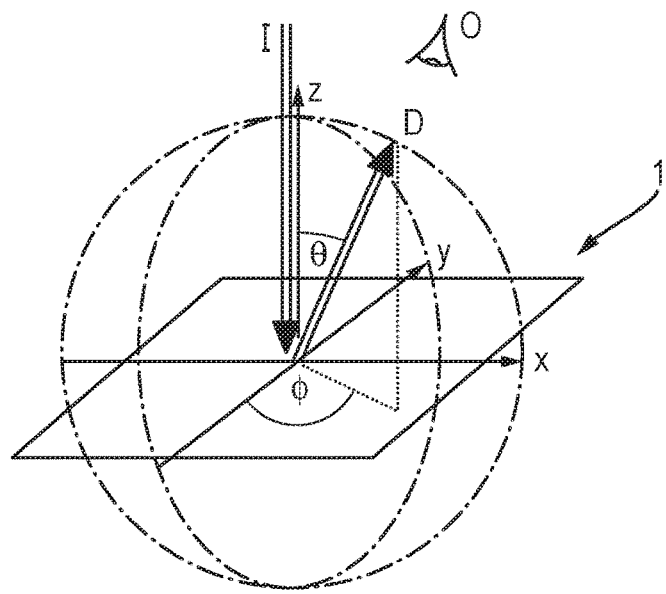
FIG. 6 shows an exemplary security device in three dimensions, to illustrate directions and angles referred to throughout the description.

FIG. 6 is a diagram illustrating the conventions that will be used below when referencing different viewing angles. An exemplary security device 1 is shown in a perspective view, lying in the plane defined by the x- and y-axes. The normal to that plane is the z-axis. Incident, on-axis light I will be redirected and an observer O at any one viewing position will see diffracted light D, the nature of which will depend on the diffraction structure and on the viewing position. The angle between the viewer O and the normal (z-axis) is referred to as the tilt angle, denoted by $\theta$ (theta), since this will change if the device is tilted about the x-axis and/or the y-axis. The rotational position of the viewer O relative to the x- and y-axes is the azimuthal angle, denoted by $\phi$ (phi), and will vary if the device is rotated about the z-axis. A change in viewing angle may comprise both a tilt (i.e. change in $\theta$) and a rotation (i.e. change in $\phi$), or could comprise just one or the other. The angle $\phi$ can also be used to describe the direction of other features lying in the plane of the device as will be seen below.

A first embodiment of a security device in accordance with the present invention will now be described with reference to FIGS. 7 and 8. FIG. 7 shows a schematic plan view of the device 1 illustrating an array of first regions 11, of which three exemplary first regions are labelled 11a, 11b and 11c. Each first region 11a, 11 b, 11c . . . has the form of an indicium which in this case consists either of the digit "5" or of a star symbol. Any indicia could be used to form the array, such as alphanumeric characters, currency identifiers (e.g. "£" or "$"), logos, symbols, silhouette portraits etc. The first regions 11a, 11 b, 11c . . . are spaced from one another by a region 20 which in this case is continuous across the device, but this is not essential. Parts of a first diffractive structure 2 such as that described above with reference to FIGS. 1 to 3 are present within each of the first regions 11a, 11b, 11c etc, and absent elsewhere such that the region 20 is non-diffractive. Hence in this example all of the shaded areas making up array 11 contain parts of the first diffractive structure 2 whilst the unshaded area 20 contains for example a planar surface, in which case it may appear as a mirror, or a matt diffusing structure.

Typically the actual diffractive structure present in each or at least some of the first regions 11a, 11 b, 11c etc. will differ from one first region to another, since each corresponds to a fragment of the same first diffractive structure taken from a different position thereon. For instance, assuming the first diffractive structure utilised in the FIG. 7 embodiment is a circular diffractive zone plate structure such as that depicted in FIG. 1, centred on point P, the maxima and minima intersecting the first region 11a will follow a curved path having an average azimuthal angle (i.e. direction in the x-y plane) than will those intersecting the adjacent first region 11b. Similarly, those fragments of the same diffractive zone plate structure in the star-shaped first regions located just radially inward of regions 11*a* and 11*b* will have a smaller pitch between adjacent maxima or minima than in regions 11*a* and 11*b*.

Hence, it should be appreciated that the first diffractive structure 2 extends across the whole device 1 in the same manner as shown in FIG. 1, but is interrupted in the areas of the non-diffractive region 20 such that only parts of its diffraction pattern are exhibited by the first regions 11. As such, features of the same diffraction effect will appear common to more than one of the first regions 11 and/or will appear to move from one first region 11 to another upon tilting or rotation of the device. For example, at any one viewing angle, the bright portions 6 will appear within certain of the first regions 11 but not others. An example of this is illustrated in FIG. 8(*a*) which shows the device 1 schematically from a first viewing angle. In this illustration only those parts of the first regions 11 which display the bright portion 6 of the first diffraction pattern are shaded. Thus, for example the first regions labelled 11*e*, 11*f*, 11*g* and 11*h* will each exhibit a part of the bright portion 6 of the first diffraction pattern (as will those first regions radially inward of them), whereas the other, unshaded first regions such as 11*a* to *d* and 11*i* will appear relatively dark. Along the radial direction from the reference point P to the first regions 11*e*, 11*f*, 11*g* and 11*h*, portions the above-described rainbow coloured spectrum making up bright portion 6 will be exhibited in a continuous manner, those parts falling into non-diffractive region 20 effectively appearing to be missing or hidden. The relatively bright nature of portion 6 of the first diffraction pattern has the effect of highlighting the first regions such as 11*e* to *h* which exhibit the bright portion 6. Indeed, depending on the relative brightness of the portion 6 compared to the rest of the first diffraction pattern, it may be only the first regions 11*e* to *h* in which the bright portion 6 is exhibited which are visible to the observer. The remaining regions such as 11*a* to *d* and 11*i* may remain dark and could be substantially indistinguishable from the non-diffractive region 20.

Upon changing the viewing angle, e.g. by rotating the device around the z-axis (change in azimuthal angle φ) or by tilting the device left-right (about the y-axis), the location of the bright portion 6 of the first diffraction pattern changes, as previously described with reference to FIG. 3. Thus, FIG. 8(*b*) schematically shows the appearance of the device 1 at a different viewing angle, again showing as shaded only those parts of the first regions 11 which display the bright portion 6 of the first diffraction pattern. It will be seen that the bright portion 6 has rotated clockwise about the reference point P (which in this case is not itself visible as it is located in the non-diffractive region 20). As a result, the bright portion 6 is now exhibited at least partially by first regions including 11*d*, 11*e*, 11*h* and 11*i* but no longer regions 11*f* or 11*g*. Upon changing the viewing angle between those shown in FIGS. 8(*a*) and (*b*), the bright feature 6 appears to move clockwise, traversing each first region 11 until it reaches a periphery of the region at which point each feature of the first diffraction pattern will cease to be exhibited as it encounters the non-diffractive region 20. When the viewing angle has progressed sufficiently, each feature of the first diffraction pattern will reappear in turn in the neighbouring first region. Thus, the bright portion 6 of the first diffraction pattern appears to "sweep" though different ones of the indicia forming first regions 11, highlighting different indicia as it moves across them. If the areas of the first diffraction pattern outside the bright feature 6 are sufficiently dark such that only those first regions 11 exhibiting the bright feature 6 are visible, the effect may be to reveal each indicia as the bright portion 6 passes though it rather than merely highlighting it.

In order that the device as a whole provides a sufficiently bright and distinctive visual effect, it is desirable that the array of first regions 11 collectively cover a significant proportion of the surface area of the device 1. Desirably at least 50% of the surface area of the device corresponds to the first regions 11, more preferably at least 70%, most preferably at least 80%. The individual first regions 11 are preferably adequately spaced from one another to clearly convey the discontinuity from one first region to the next, since the continuous nature of the first diffraction pattern extending between them then appears more counterintuitive. However, the first regions need not be entirely isolated from one another. For example, narrow connecting lines between the first regions in which the first diffraction structure is present will not detract significantly from the desired effect.

The array of first regions 11 is preferably configured so as to demonstrate visual integration between the indicia and the first diffraction pattern. For example, where the first diffraction pattern is circularly symmetric (as in the FIG. 7/8 example), the array of first regions 11 preferably also has a high degree of rotational symmetry and desirably is centred on the reference point P of the first diffraction pattern. In cases where the first diffractive structure has some other form, e.g. as shown in FIG. 4 or 5, the array of first regions 11 is preferably designed accordingly. For instance where the first diffractive structure is a zone plate based on a cylindrical surface as in FIG. 4, the array of first regions is preferably centred on and symmetric about the reference line.

FIGS. 9(*a*) and 9(*b*) show two further embodiments of security devices 1, in both case illustrating the full array of first regions 11 which as noted above may not all be visible at any one viewing angle. In the FIG. 9(*a*) example, the first indicia 11 comprise a set of concentric, circular lines 11*a*, 11*b*, 11*c* . . . which collectively form a dense array of areas across which the first diffraction effect will be exhibited. In the example shown each line is formed of a series of spaced elongate first regions aligned along the circle, but this is not essential—for instance, each concentric circle could be a complete (solid) line. In other cases, each of the lines illustrated could take the form of alphanumerical characters, e.g. microtext, such as "20 POUNDS". The first regions 11 are spaced as before by portions of a non-diffractive region 20. The FIG. 9(*b*) example is similar to that of FIG. 9(*a*) except here the size of the first regions 11 increases with increasing distance from the reference point P, i.e. radially outward in this case. This is preferred since the array 11 then appears to possess a similar perspective as that displayed by the first diffraction pattern.

As mentioned in passing above, it is possible for the first diffractive structure to be formed of two or more diffractive zone plate structures each based on a different continuously curved surface. In this case the resulting device is effectively an assembly of two or more devices of the sort described above. Two examples of such security device assemblies 1' will now be described with reference to FIGS. 10(*a*) and 10(*b*). In both cases, the Figures show (i) a schematic representation of the first diffractive structure, in plan view; (ii) a plot representing the curvature of each of the surfaces on which the various portions of the first diffractive structure are based, taken along a line which passes through the centre of the first diffractive structure; and (iii) a plan view schematically showing the arrangement of the first regions 11.

In the FIG. 10(a) embodiment, the first diffraction structure 2' comprises a plurality of diffractive zone plate structures 2a, 2b, 2c and 2d, each occupying a respective area of the device, the boundaries of which are represented by dot-dashed lines in the Figure. The first area 2a is circular and contains a diffractive zone plate structure based on a hemispherical surface of radius $R_a$, and hence will comprise a series of concentric maxima and minima (not shown) much like that depicted in FIG. 1, but compressed to fit within area 2a of the device. The pitch of the bands will decrease with radial distance from centre point $P_a$ which is a reference point representing the fixed position about which features of the diffraction pattern that will be generated by the diffraction structure in area 2a will appear to move upon tilting. The second region 2b is annular and concentric with the first area 2a such that the first area 2a abuts and is surrounded by area 2b. The diffractive zone plate structure in second area 2b is based on a semi-toroid (i.e. a half-"donut" shape), which has an internal radius (in the z-direction) of $R_b$, which here is greater than $R_a$ meaning that the curvature of the surface is shallower in second area 2b than in area 2a. This is best depicted in FIG. 10(a)(ii). The corresponding zone plate structure in area 2b will again comprise a series of concentric maxima and minima centred on point $P_a$. However, in this area 2b, the pitch of the maxima and minima will decrease with increasing distance from a circular reference line $P_b$ (both towards and away from $P_a$), which represents the fixed reference position for area 2b.

Areas 2c and 2d are further annular areas of the device located outside area 2b and again arranged concentrically. The diffraction structure in each of areas 2c and 2d is again a diffractive zone plate structure based on a respective semi-toroidal surface of different internal radius. In area 2c the internal radius $R_c$ is less than both $R_a$ and $R_b$, making the curvature most pronounced in this area. In area 2d, the internal radius $R_d$ lies between $R_a$ and $R_b$ giving an intermediate level of curvature. In both areas the maxima and minima will be concentric circles centred on point $P_a$ but with their pitch decreasing with distance away from respective reference lines $P_c$ and $P_d$.

Due to the different diffractive structures in each of the regions 2a to 2d, a different diffraction pattern with different movement effects will be exhibited by each. As in previous embodiments, selected parts of each diffractive structure in the various areas of the device will be retained in corresponding first regions of the device, and the rest of each diffractive structure will be inhibited. Thus, FIG. 10(a)(iii) shows an exemplary arrangement of first regions 11 in which the diffractive structures 2a to 2d are retained, with the concentric circular dashed lines indicating the boundaries between the different areas (as in FIG. 10(a)(i)). A plurality of such first regions 11 is provided in each of the different areas 2a to 2d, in order that the continuity between different indicia formed from parts of the same diffractive structure is demonstrate. Hence, for example, first regions 11a, 11b and 11c are located adjacent one another in area 2d of the device where the toroidal curvature is intermediate. As the device is tilted, features of the diffraction pattern generated by the diffractive structure in area 2d will appear to move from region 11a to region 11b and then 11c, or in the opposite direction. However, those features will not appear to transition from the outermost "5"-shaped regions to any of the radially inward indicia, since these contain a different diffractive structure. Likewise, star-shaped regions 11k, 11l and 11m are located in area 2c and each contain a part of the diffraction structure based on a toroid with internal radius $R_c$, giving rise to increase curvature. Upon tilting, features of this diffraction pattern will appear to move between regions 11k, 11l and 11m but not to first regions in other areas of the device. Similarly, first regions 11n, 11o and 11p in area 2b of the device will exhibit a movement effect between them as will first regions 11q, 11r and 11s in area 2a.

Since the diffractive zone plate structure 2' is different in each area 2a to 2d of the device, the movement effects exhibited within each area will also differ, e.g. in terms of colour and/or apparent "speed" of the pattern features upon tilting. Overall this gives rise to a particularly complex visual effect and therefore a high security level since the appearance is extremely difficult to imitate.

In the FIG. 10(a) example, the spherical and semi-toroidal surfaces on which the diffractive structures in areas 2a, 2b, 2c and 2d are based are all arranged so as to present convex surfaces extending in the same direction as one another. Yet more complex effects can be achieved if a mixture of convex and concave surfaces is utilised. Thus, FIG. 10(b) shows a variant of the FIG. 10(a) embodiment which has substantially the same construction except that here the spherical surface on which the diffraction structure in central area 2a is based, and the semi-toroidal surface on which the diffraction structure in annular area 2c is based have been made concave, whilst the remaining areas 2b and 2d are unchanged. This has the result that the difference between the movement effects in the various areas will be further enhanced since upon tiling the device, the diffraction pattern features in areas 2a and 2c will appear to move in one direction whilst those in areas 2b and 2d will simultaneously appear to move in the opposite sense.

Whilst in the FIG. 10 examples, the areas 2a to 2d have been depicted as concentric circles, any other arrangement of areas is possible including elliptical areas, parabolic areas or other forms of curvi-linear area as well as various forms of polygon. Similarly, the curved surfaces on which the diffraction structures are based are not limited to hemispheres and toroids but could include any mixture of different surface shapes including cylinders, aspherical surfaces, etc.

In the previous examples, all of the area of the device 1 outside the first regions 11 is occupied by a non-diffractive region 20. This is desirable in many cases. However, in a further embodiment, the device 1 may further comprise a second diffractive structure arranged in second regions 12 of the device, which are spaced from the first regions 11. FIG. 11 shows an example of such an embodiment. Here the array of first regions 11 is the same as described previously with reference to FIGS. 7 and 8. However, between the first regions 11 are provided a number of second regions 12 which here are arranged in two concentric rings 12a, 12b. Within each of the second regions 12 is provided an off-axis diffractive structure which exhibits a different diffractive effect from that of the first diffractive structure. For example, the second regions 12 could contain an off-axis hologram or one or more diffraction grating structures. This increases the complexity of the device since whilst the first regions 11 will continue to exhibit the first diffraction pattern in the manner previously described, the second regions can be configured to exhibit other effects. For example, the concentric circles 12a, 12b could be configured to diffract light to the viewer at substantially all viewing angles so as the first regions are highlighted or revealed by the sweep of the first diffraction pattern, they appear to move relative to the second regions 12.

The first (and any second) diffractive structures can be generated in various ways. FIGS. 12 and 13 show two possible recording geometries for holographic generation of a diffractive zone plate structure suitable for use as the first diffractive structure in any of the presently disclosed embodiments. Referring first to FIG. 12, a resist layer 31 (optionally supported on a transparent substrate) is placed in near contact with an object having a continuously curved reflecting surface of the desired shape. In the present case this is provided by a spherical converging lens 32 (which may be coated with a reflective material such as metal on its reverse side). A collimated beam of laser light L is then arranged to fall on this combination parallel to the optical axis of the lens 32 (e.g. via mirror 33), first passing through the back surface of the resist plate, then through the resist layer 31 itself before impinging on the lens 32. Light is then reflected back from at least the back surface of the lens 32. This reflected light will interfere with the incident light to form a holographic interference pattern within the plane of the resist, resulting in concentric interference fringes of high and low light intensity, following the same lateral pattern as shown previously in FIG. 1. Each successive bright fringe represents a further $2\pi$ phase difference between the incident and reflected wavefronts.

This process essentially corresponds to recording an on-axis hologram of the lens 32. Since the lens 32 and resist plate 31 are in near contact, the resulting hologram will have a viewing angle which covers essentially the full angular hemisphere. This ensures that the first diffraction pattern 5, described above, will be visible at substantially all viewing angles.

The process can be adapted to record zone plate structures from any desired curved surface by replacing the lens 32 with an appropriately shaped reflecting surface. For example, FIG. 13 shows the use of a bi-concave lens 32' to create a Fresnel zone plate structure of a diverging lens. In still further examples, the lens 32, 32' could be replaced by a cylindrical lens to create a cylindrical zone structure as shown in FIG. 4, or by an ellipsoidal surface to create the zone structure shown in FIG. 5.

Having created the first diffractive structure across the resist plate 31, the array of indicia 11 can then be formed by destroying the first diffractive structure 2 in all portions of the resist plate which fall outside the desired first regions 11. Options for achieving this are discussed below. However, in a more preferred implementation the first diffractive structure 2 and the array of indicia 11 can be formed holographically in a single process step using the method shown in FIG. 14. The apparatus essentially corresponds to that already described with reference to FIG. 12, except for the addition of a patterned mask 34 carrying the desired arrangement of first regions 11. Each first region 11 corresponds to a transparent portion of the mask 34 whilst the remainder 20 of the mask is substantially opaque. For example, the mask 34 could comprises a metal layer, demetallised in accordance with the desired pattern of first regions 11, carried on a transparent support. The arrangement is illuminated with laser light in the same manner as previously described. However, portions of the resist layer 31 corresponding to the opaque areas 20 of the mask 34 do not receive the reflected light from lens 32 and hence do not record any of the interference pattern, resulting in a non-diffractive region.

In each of the above methods, for a lithographic resist material (e.g. Shipley S1813), the laser light L may typically have a wavelength of 412 nm, 441 nm or 458 nm. When the exposed resist plate 31 is then developed in a suitable substance (e.g. Shipley Micro posit 303), those regions of the resist which were exposed to high intensity light (e.g. interference maxima in the holographic techniques, or under the path of the laser beam or electron beam in the direct-write methods) are removed by the action of the developer to become troughs, whilst those areas which are not exposed or experience light intensity (e.g. interference minima) remain to become surface relief peaks. Where the resist plate has been masked from the interference pattern as in the FIG. 14 example, no surface relief will arise.

FIG. 15(a) shows an exemplary cross-section through a portion of the device in which non-diffractive regions 20 have been formed either by destroying the first diffraction pattern 2 or by masking those regions from the interference pattern as previously described. It will be seen that a portion of the first diffractive structure 2 is present in each of the first regions 11. In the non-diffractive regions 20, there is no surface relief and the carrier exhibits a planar surface 21, which may appear as a mirror in the finished device.

Figure 15B:
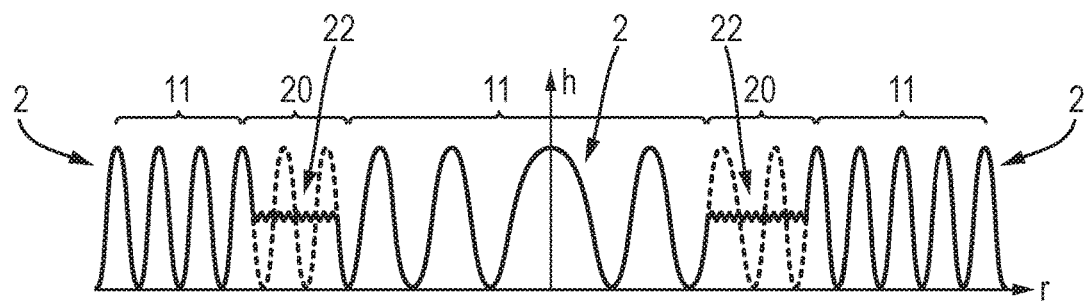

An alternative construction is shown in FIG. 15(b). Here, rather than a planar surface in the non-diffractive regions 20, a light-diffusing structure 22 is provided which will give the non-diffractive regions a matt appearance. This can be achieved through the use of a mask 34 in the same manner as shown in FIG. 14 but in which the portions 20 are not opaque but carry some light-scattering structure so that the corresponding parts of the resist plate are still masked from the interference pattern but are instead exposed to a substantially random pattern of different light intensities. This results in a light-diffusing profile 22 which replaces the first diffractive structure in the non-diffractive regions 20. Alternatively, the same result could be achieved in a two-step process: first exposing the first regions to the light interference pattern using the same mask 34 as shown in FIG. 14, comprising opaque and transparent portions, and then replacing the mask 34 with a second mask (not shown) which carries a light-diffusing structure in the portions 20, and exposing the resist again. The areas between the light diffusing portions 20 in the second mask could be opaque or transparent. The two exposure steps should be carried out in registration with one another, e.g. using registration pins to ensure accurate placing of both masks. Of course, a combination of planar areas 21 and matt structures 22 could be used in the non-diffractive regions if desired.

Figure 16:
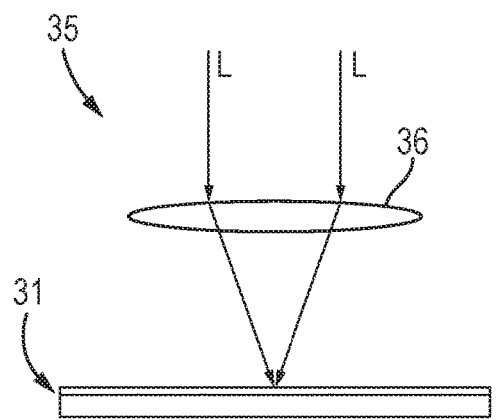
Figure 17:
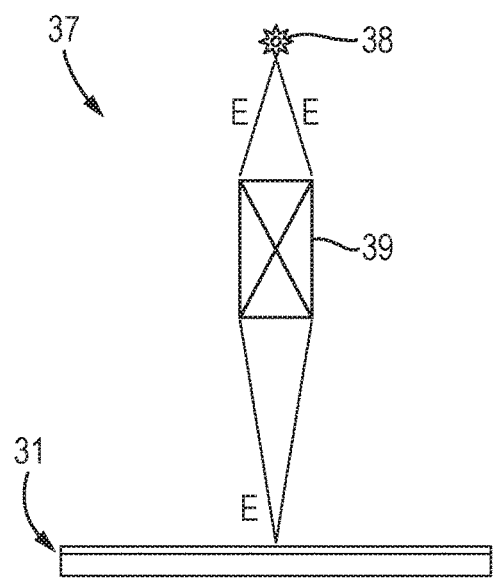

Holographic methods of generating the first diffractive structure 2 such as those described above are particularly preferred since these result in a sinusoidal profile (see FIG. 2(a)) with reduced diffraction efficiency as compared with other techniques. However, alternative techniques are available for forming the first diffractive structure and some of these, involving direct writing of the structure, are illustrated in FIGS. 16 and 17. FIG. 16 schematically illustrates the use of an optical fringe writer 35 in which collimated laser light L is focussed by optics 36 onto the resist plate 31. The fringe writer is controlled to move the laser beam in accordance with the desired pattern to which the resist is to be exposed. This will be determined by mathematically modelling the interference pattern that would generated by the desired continuously curved surface (e.g. the lens 32 shown in FIG. 12) to ascertain the form of the corresponding zone plate structure. As an alternative to an optical fringe writer 35, the resist plate 31 could be exposed to the desired pattern using electron beam lithography, for which schematic apparatus 37 is shown in FIG. 17. A source of electrons 38 is used to generate an electron beam E which is then focussed and controlled by beam optics 39 as known in the art to expose the resist layer 31 in accordance with the desired pattern.

Figure 18:
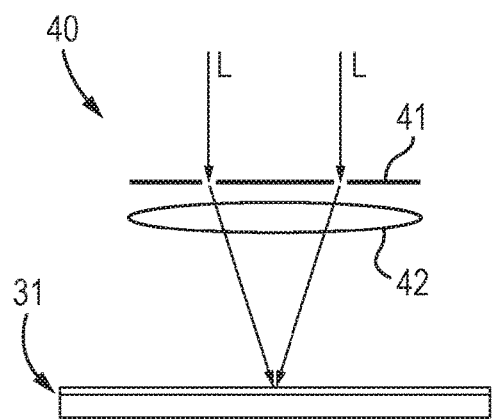
Figure 19:
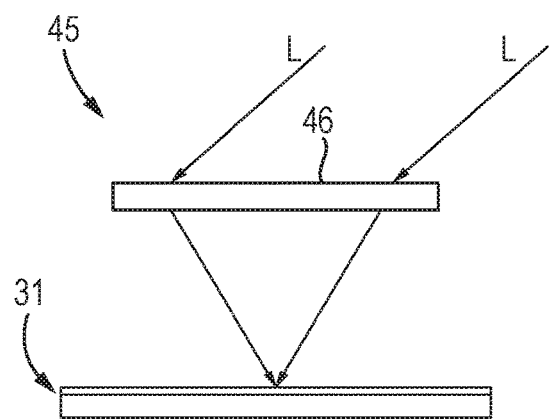

Direct-write methods such as these can also be used to form the non-diffractive regions 20. For example, having formed the first diffractive structure 2 across the whole device using the method of FIG. 12, an optical fringe writer or electron beam lithography could be used to destroy the first diffractive structure in the non-diffractive regions 20 or to replace it with a matt structure 22. Alternatively, the non-diffractive structure could be formed using a dot matrix optical writer, as shown in FIG. 18, in which a collimated laser beam L is passed through a mask 41 defining at least two apertures and focussed by optics 42 onto the resist plate 31 to form the desired pattern from a series of exposed dots. Each exposed dot in fact is formed of a series of lines resulting from interference between the at least two light beams passed by the mask 41. In a still further example, the non-diffractive structure could itself be formed holographically, e.g. by H1-H image plane rainbow lithography as illustrated in FIG. 19. Here, a H1 transmission hologram 46 (e.g. of a light-diffusing structure) is illuminated by off-axis laser light L passing therethrough, the resulting holographic image being recorded in the resist plate 31.

If the device is to include a second diffractive structure as discussed with reference to FIG. 11, this can be generated using any of the methods shown in FIGS. 16 to 19.

It is also possible to form the first diffractive structure 2, the non-diffractive structure 21/22 and any second diffractive structure in their respective regions 11, 20 and 12 of resist plate 31 in a single process step, by digitally combining the desired structures to generate the surface relief pattern required across the whole device. This can then be transferred into the resist plate 31 by a direct writing method such as an optical fringe writer or electron beam lithography, controlled in accordance with the combined surface relief pattern.

The exposed resist plate 31 can then be developed to form a corresponding surface relief in the same manner as previously described.

Having developed the relief structure, the resist plate can be used as a cast to form a master hologram relief in a suitably robust material, resulting in a replication tool from which copies of the original relief can be embossed into suitable carriers such as a lacquer layer. Alternatively the master hologram relief can be used as a cast-cure mould for replicating the surface relief into carrier resin which can then be cured to fix the relief. Typically, the master hologram will not be cast from the developed resist until the non-diffractive structure (and any second diffractive structure) has been formed as discussed above, although in other cases the non-diffractive structure (and any second diffractive structure) could be formed directly in the master hologram relief, i.e. after casting of the first diffraction structure. (In alternative embodiments where the first diffractive structure is to be formed as an amplitude-difference device, the so-produced relief can be used to form corresponding demetallised regions using the method disclosed in US-A-2009/0317595.)

Once the first diffractive structure, the non-diffractive structure and any second diffractive structures have been formed, the resulting surface relief can be transferred into a suitable carrier, e.g. by embossing or cast-curing as mentioned above. To improve the visibility of the diffraction pattern, typically a reflection enhancing layer such as metal or a high refractive index material (e.g. ZnS) will be applied onto the carrier in such a way as to conform to the contours of the surface relief, preferably on both sides of the reflection enhancing layer so that the diffraction patterns can be viewed from both sides of the device. For example, a metal layer of aluminium, copper, chromium or the like (or any alloy thereof) may be applied to the surface relief by vapour deposition or similar. In other cases, a reflective ink (e.g. metallic ink) could be used for this purpose and applied by printing or another coating technique.

FIG. 20(*a*) shows schematically an example of a security device 1 formed in this way, in cross-section. The carrier 50 comprises a lacquer or resin into which a surface relief combining the first diffractive structures 2 with non-diffractive regions 20 has been formed, e.g. by embossing or cast-curing. The carrier 50 is preferably transparent (optionally having a coloured tint) in order that the diffraction effects can be viewed through it, but this is not essential if the effects can be viewed from the other side. A reflection enhancing layer 51 (which may be of any of the types mentioned above) follows the contours of the relief structure. Optionally, the reflection enhancing layer is covered by a further layer 52, which is preferably transparent, such as a lacquer layer which may act as a protective layer and/or could have further functionality. For example, the layer 52 could carry a coloured tint so that the colour appearance of the device 1 is different when viewed from each side of the device. In the example shown, since the reflection enhancing layer continues across the non-diffractive regions 20 (which here are planar), these portions of the device will appear as a mirrored surface.

The layer 52 could also act as a resist layer. For example, as shown in FIG. 20(*b*), the layer 52 could be selectively applied to certain areas only of the device (e.g. by printing), resulting in gaps 53 which may define an image and/or could correspond to the non-diffractive regions 20 as in the present example. The patterned layer 52 can then be used as an etch resist such that portions of the reflection enhancing layer 51 corresponding to each of the gaps are removed, resulting in demetallised areas.

FIG. 24(*c*) shows an example of a security device 1 in plan view in which the non-diffractive regions 20 have been demetallised using the above-described method. In this case the first regions 11 comprise an array of triangular and chevron-shaped indicia arranged in a pattern around a central circular region. The first regions 11 are spaced by the non-diffractive regions 20 which here are also transparent due to the absence of the reflection-enhancing layer.

In other cases, portions of the first regions 11 themselves could be demetallised to further increase the complexity of the device. Preferably the demetallised image is centred on the reference point P of the first diffraction pattern 5 so as to demonstrate accurate register between the demetallisation and the diffractive structure.

The security device may alternatively or additionally be provided with an image layer such as a printed image. FIG. 21(*a*) is a cross section showing an example of a security device 1 with an image layer 55, which in this case is applied to the reflection enhancing layer 51. In other examples the image layer 55 could be applied between the carrier 50 and the reflection enhancing layer 51, or even on the outside of carrier 50 or protective lacquer 52. An example of an image carried by layer 55 is shown in FIG. 21(*b*). Here a printed image 55 is provided in the form of a star outline and a number "50" at the centre of the device. The ink or other material forming the image layer 55 is preferably at least semi-opaque so that the diffractive effects are concealed under the image layer where it is present. The image 55 is preferably centred on the reference point of the first diffractive structure so as demonstrate register between the two.

FIGS. 22, 23 and 24 depict examples of security documents in which security devices of the sorts described above have been incorporated. FIG. 22 shows a first exemplary security document, here a banknote 100, in (a) plan view and (b) cross-section along line Q-Q'. Here, the banknote 100 is a polymer banknote, comprising an internal transparent polymer substrate 102 which is coated on each side with opacifying layers 103a and 103b in a conventional manner. In some cases, the opacifying layers may be provided on one side of the substrate 102 only. The opacifying layers 103a and 103b are omitted in a region of the document so as to define a window 101, here having a square shape. Within the window region 101 is located a security device 1 in accordance with any of the embodiments discussed above. The security device 1 may be formed by cast-curing a suitable carrier material 50 onto the substrate 102, in which the desired relief structure is formed. Alternatively, the security device 1 may have been formed separately on a security article such as a transfer patch or label. In this case, the security device 1 may be affixed to the transparent substrate 102 inside the window region 101 by means of a suitable adhesive. Application may be achieved by a hot or cold transfer method e.g. hot stamping.

It should be noted that a similar construction could be achieved using a paper/plastic composite banknote in which the opacifying layers 103a and 103b are replaced by paper layers laminated (with or without adhesive) to an internal transparent polymer layer 102. The paper layers may be omitted from the window region from the outset, or the paper could be removed locally after lamination. In other constructions, the order of the layers may be reversed with a (windowed) paper layer on the inside and transparent polymer layers on the outside.

Security devices of the sort disclosed herein are particularly well suited to application to documents with polymer substrates such as that shown in FIG. 22 since zone plate structures such as those used to form the first diffractive structure replay particularly well when they are supported on a flat, smooth surface. The surface of a polymer substrate is typically smoother than those of conventional, e.g. paper substrates.

In FIG. 23, the banknote 100 is of conventional construction having a substrate 102 formed for example of paper or other relatively opaque or translucent material. The window region 101 is formed as an aperture through the substrate 102. The security device 1 is applied as a patch overlapping the edges of window 101 utilising an adhesive to join the security article to the document substrate 102. Again, the application of the security device and document could be achieved using various methods including hot stamping. FIG. 23(c) shows a variant in which the window 101 is omitted and the device 1 is simply applied to a section of the substrate 102 using any convenient application technique such as hot stamping. In such arrangements the device 1 will of course only be viewable from one side of the security document 100.

FIG. 24 depicts a third example of a security document, again a banknote 100, to which a security article 105 in the form of a security thread or security strip has been applied. Three security devices 1 each carried on the strip 105 are revealed through windows 101, arranged in a line on the document 100. Two alternative constructions of the document are shown in cross-section in FIGS. 24(b) and 24(c). FIG. 24(b) depicts the security thread or strip 105 incorporated within the security document 100, between two portions of the document substrate 102a, 102b. For example, the security thread or strip 105 may be incorporated within the substrate's structure during the paper making process using well known techniques. To form the windows 101, the paper may be removed locally after completion of the paper making process, e.g. by abrasion. Alternatively, the paper making process could be designed so as to omit paper in the desired window regions. FIG. 24(c) shows an alternative arrangement in which the security thread or strip 105 carrying the security device 1 is applied to one side of document substrate 102, e.g. using adhesive. The windows 101 are formed by the provision of apertures in the substrate 102, which may exist prior to the application of strip 105 or be formed afterwards, again for example by abrasion.

Many alternative techniques for incorporating security documents of the sorts discussed above are known and could be used. For example, the above described device structures could be formed on other types of security document including identification cards, driving licenses, bankcards and other laminate structures, in which case the security device may be incorporated directly within the multilayer structure of the document.

The invention claimed is:

1. A diffractive security device comprising at least a first diffractive structure defined in a carrier layer,
the first diffractive structure being an on-axis diffractive zone plate structure of a continuously curved surface configured such that when the device is illuminated by on-axis light a first diffraction pattern generated by the first diffractive structure can be viewed from at least a first side of the device at substantially all viewing angles, the first diffraction pattern exhibiting a reference point or reference line relative to which other features of the first diffraction pattern appear to move when the viewing angle is changed;
wherein the device has an array of first regions in the form of indicia, a respective portion of the first diffractive structure being present within each of the indicia to exhibit a respective portion of the first diffractive pattern, the first regions being spatially separated from one another by one or more non-diffractive regions of the device; and
upon changing the viewing angle in a continuous sense, features of the first diffraction pattern appear to move from one first region to the next so as to highlight and/or reveal different indicia of the array.

2. A diffractive security device according to claim 1, wherein the first diffractive structure is a diffractive zone plate structure of a dome, a hemisphere, a hemi-ellipsoid, a semi-cylinder, a semi-toroid, or a portion thereof.

3. A diffractive security device according to claim 1 wherein the diffractive zone plate structure is a phase difference zone plate structure formed as a surface relief in the carrier layer, the diffractive security device further comprising a reflection enhancing layer following the contours of the surface relief on the carrier layer.

4. A diffractive security device according to claim 3, wherein the reflection enhancing layer is provided in the first regions and is absent in the non-diffractive regions.

5. A diffractive security device according to claim 1 wherein the proportion of the area of the device occupied by the first regions is at least 25%, 50%, and 70%.

6. A diffractive security device according to claim 1 wherein the array of first regions is centred on the reference point or line of the first diffraction pattern.

7. A diffractive security device according to claim 1, wherein the array of first regions is symmetric about the reference point or line of the first diffraction pattern.

8. A diffractive security device according to claim 1, wherein the first regions are arranged along a plurality of lines, each line having a different, constant distance from the reference point or line of the first diffraction pattern, the lines having the form of circles, ellipses or straight lines.

9. A diffractive security device according to claim 1, wherein the first regions are arranged along a continuous line, the distance of the line from the reference point or line of the first diffraction pattern increasing continuously, wherein the first diffraction pattern has a reference point and the first regions are arranged along a spiral line centred on the reference point.

10. A diffractive security device according to claim 1, wherein the first regions are of increasing size with increasing distance from the reference point or line of the first diffraction pattern.

11. A diffractive security device according to claim 1, wherein the non-diffractive regions are substantially specularly reflective or contain a light diffusing matt structure.

12. A diffractive security device according to claim 1, further comprising one or more second regions in the form of indicia interspersed with the array of first regions and spaced from one another and from the first regions by the non-diffractive region(s), a second diffractive structure being present in the or each second region, the second diffractive structure being an off-axis diffractive structure configured such that when the device is illuminated by on-axis light a second diffraction pattern generated by the second diffractive structure can be viewed from at least the first side of the device at at least some off-axis viewing angles.

13. A diffractive security device according to claim 1, wherein the indicia are any of: alphanumeric characters, currency identifiers, symbols, text, strings of digits, serial numbers, silhouette portraits or logos.

14. A diffractive security device assembly comprising a plurality of security devices each in accordance with claim 1, arranged in respective laterally offset areas, wherein the first diffractive structure of each of the security devices is based on a different continuously curved surface.

15. A security article comprising a security device according to claim 1.

16. A security document comprising a security device according to claim 1.

17. A diffractive security device according to claim 1, wherein the first regions are discernable from one another.

18. A diffractive security device according to claim 1, wherein adjacent ones of the first regions are separated by a discontinuity of the first diffractive structure.

19. A diffractive security device according to claim 1, wherein the first regions are discernable from one another due to adjacent ones of the first regions being separated by a discontinuity of the first diffractive structure.

20. A method of making a diffractive security device, comprising forming at least a first diffractive structure in a carrier layer,
the first diffractive structure being an on-axis diffractive zone plate structure of a continuously curved surface configured such that when the device is illuminated by on-axis light a first diffraction pattern generated by the first diffractive structure can be viewed from at least a first side of the device at substantially all viewing angles, the first diffraction pattern exhibiting a reference point or reference line relative to which other features of the first diffraction pattern appear to move when the viewing angle is changed;
wherein the device has an array of first regions in the form of indicia, a respective portion of the first diffractive structure being present within each of the indicia to exhibit a respective portion of the first diffractive pattern, the first regions being spaced by one or more non-diffractive regions of the device; and
upon changing the viewing angle in a continuous sense, features of the first diffraction pattern appear to move from one first region to the next so as to highlight and/or reveal different indicia of the array.

21. A method of making a diffractive security device according to claim 20, wherein the first diffractive structure is formed by:
providing a replication tool having a surface relief defining the first diffractive structure; and
using the replication tool to form the surface of the carrier layer according to the surface relief, and preferably
applying a reflection enhancing layer onto the carrier layer so as to follow the contours of the surface relief.

22. A method of making a diffractive security device according to claim 21, wherein the replication tool is manufactured by creating the surface relief in a recording medium layer and preferably transferring the surface relief to the surface of the replication tool.

23. A method of making a diffractive security device according to claim 22, wherein the surface relief is created in the recording medium layer by forming a first surface relief structure corresponding to the first diffractive structure and then in the non-diffractive region(s) of the device destroying the first surface relief structure.

24. A method of making a diffractive security device according to claim 22, wherein the surface relief is holographically generated in first regions only of the recording medium layer by exposing the recording medium layer to a light interference pattern from the continuously curved surface through a patterned mask defining the array of first regions.

25. A method of making a diffractive security device according to claim 22, wherein the first surface relief structure is formed in first regions only of the recording medium layer using an optical fringe writer or electron beam lithography.

26. A method of making a diffractive security device according to claim 20, further comprising forming a second diffractive structure in one or more second regions in the form of indicia interspersed with the array of first regions and spaced from one another and from the first regions by the non-diffractive region(s), the second diffractive structure being an off-axis diffractive structure configured such that when the device is illuminated by on-axis light a second diffraction pattern generated by the second diffractive structure can be viewed from at least the first side of the device at at least some off-axis viewing angles.

27. A method of making a diffractive security device according to claim 26 wherein the second surface relief structure is holographically generated by exposing second regions of the recording medium layer to a light interference pattern from an off-axis transmission hologram.

28. A method of making a diffractive security device according to claim 26 wherein the second surface relief structure is formed using an optical fringe writer or electron beam lithography.

* * * * *